(12) United States Patent
Peters et al.

(10) Patent No.: US 6,521,530 B2
(45) Date of Patent: Feb. 18, 2003

(54) COMPOSITE INTERPOSER AND METHOD FOR PRODUCING A COMPOSITE INTERPOSER

(75) Inventors: Michael G. Peters, Santa Clara; Mark Thomas McCormack, Livermore; Aris Bernales, Santa Clara, all of CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/866,094

(22) Filed: May 23, 2001

(65) Prior Publication Data

US 2002/0076919 A1 Jun. 20, 2002

Related U.S. Application Data

(63) Continuation-in-part of application No. 09/315,785, filed on May 20, 1999, now Pat. No. 6,239,485, which is a continuation-in-part of application No. 09/191,755, filed on Nov. 13, 1998, now Pat. No. 6,081,026.

(51) Int. Cl.[7] .............................................. H01L 21/44
(52) U.S. Cl. ........................ 438/667; 438/108; 438/118; 438/125; 438/458; 438/612; 438/668; 438/672; 257/621; 257/676
(58) Field of Search ................................ 438/108, 118, 438/125, 458, 612, 667, 668, 672, 460; 257/621, 676, 698

(56) References Cited

U.S. PATENT DOCUMENTS

| | | |
|---|---|---|
| 4,088,546 A | 5/1978 | Wu et al. |
| 4,202,007 A | 5/1980 | Dougherty et al. |
| 4,271,588 A | 6/1981 | Nowak |
| 4,547,834 A | 10/1985 | Dumont et al. |
| 4,597,029 A | 6/1986 | Kucharek et al. |
| 4,600,970 A | 7/1986 | Bauer |
| 4,601,526 A | 7/1986 | White et al. |
| 4,672,152 A | 6/1987 | Shinohara et al. |
| 4,706,165 A | 11/1987 | Takenaka et al. |
| 4,736,276 A | 4/1988 | Ushifusa et al. |
| 4,821,142 A | 4/1989 | Ushifusa et al. |
| 4,854,038 A | * 8/1989 | Wiley .......................... 29/830 |
| 4,884,170 A | * 11/1989 | Ohki et al. ................. 361/414 |
| 4,922,377 A | 5/1990 | Matsumoto et al. |
| 4,926,241 A | 5/1990 | Carey |

(List continued on next page.)

FOREIGN PATENT DOCUMENTS

| | | |
|---|---|---|
| EP | 0506225 A2 | 9/1992 |
| EP | 0506225 A3 | 9/1992 |
| JP | 4-53195 | * 2/1992 |

OTHER PUBLICATIONS

Craig N. Ernsberger et al. FLEXCON '96, "Colaminated Multilayer Flip Chi T–BGA Package Development" 29–43.

(List continued on next page.)

Primary Examiner—Eddie Lee
Assistant Examiner—N. Drew Richards
(74) Attorney, Agent, or Firm—Coudert Brothers LLP

(57) ABSTRACT

A composite interposer for providing power and signal connections between an integrated circuit chip or chips and a substrate. The interposer includes a signal core formed from a conductive power/ground plane positioned between two dielectric layers. A method for fabricating a composite interposer comprising disposing a silicon layer on a substrate, and selectively etching the silicon layer down to the substrate to develop silicon openings with a silicon profile, and to expose part of the substrate. Vias are formed through the exposed part of the substrate. The method additionally includes filling the vias and the silicon openings with a filler material (e.g., a high-aspect-ratio-capable photodefinable epoxy polymer) to form filled silicon openings and filled vias, forming first openings through the filled silicon openings and through the filled vias, forming second opening through filler material to expose semiconductor devices on the silicon layer, and interconnecting electrically, through the first openings and through the second openings, the exposed semiconductor devices with pads disposed against a bottom of the substrate.

37 Claims, 34 Drawing Sheets

U.S. PATENT DOCUMENTS

| | | |
|---|---|---|
| 4,931,134 A | 6/1990 | Hatvervitz |
| 4,984,132 A | 1/1991 | Sakurai et al. |
| 5,012,047 A | 4/1991 | Dohya |
| 5,019,535 A | 5/1991 | Wojnarowski et al. |
| 5,036,431 A | 7/1991 | Adachi et al. |
| 5,097,393 A | 3/1992 | Nelson et al. |
| 5,142,448 A | 8/1992 | Kober et al. |
| 5,159,530 A | 10/1992 | Komoto |
| 5,264,729 A | 11/1993 | Rostoker et al. |
| 5,281,151 A | 1/1994 | Arima et al. |
| 5,325,268 A | 6/1994 | Nachnani et al. |
| 5,331,514 A | 7/1994 | Kuroda |
| 5,354,955 A | 10/1994 | Gregor et al. |
| 5,362,656 A | 11/1994 | McMahon |
| 5,367,435 A | 11/1994 | Andros et al. |
| 5,375,042 A | 12/1994 | Arima et al. |
| 5,382,757 A * | 1/1995 | Ishida ................ 174/250 |
| 5,386,341 A | 1/1995 | Olson et al. |
| 5,394,303 A | 2/1995 | Yamaji |
| 5,396,034 A | 3/1995 | Fujita et al. |
| 5,404,044 A | 4/1995 | Booth et al. |
| 5,407,864 A | 4/1995 | Kim |
| 5,418,689 A | 5/1995 | Alpaugh et al. |
| 5,419,038 A | 5/1995 | Wang et al. |
| 5,426,563 A | 6/1995 | Moresco et al. |
| 5,428,190 A | 6/1995 | Stopperan |
| 5,435,733 A | 7/1995 | Chernicky et al. |
| 5,448,020 A | 9/1995 | Pendse |
| 5,450,290 A * | 9/1995 | Boyko et al. .......... 174/260 |
| 5,468,681 A | 11/1995 | Pasch |
| 5,477,933 A | 12/1995 | Nguyen |
| 5,479,110 A | 12/1995 | Crane et al. |
| 5,491,612 A | 2/1996 | Nicewarner, Jr. |
| 5,530,288 A | 6/1996 | Stone |
| 5,534,666 A | 7/1996 | Ishida |
| 5,544,017 A | 8/1996 | Beilin et al. |
| 5,558,928 A | 9/1996 | DiStefano et al. |
| 5,590,460 A | 1/1997 | DiStefano et al. |
| 5,691,041 A | 11/1997 | Frankeny et al. |
| 5,707,881 A | 1/1998 | Lum |
| 5,708,568 A | 1/1998 | Ostendorf |
| 5,719,749 A | 2/1998 | Stopperan |
| 5,770,476 A | 6/1998 | Stone |
| 5,789,815 A | 8/1998 | Tessier et al. |
| 5,854,534 A | 12/1998 | Beilin et al. |
| 5,893,727 A | 4/1999 | Lau et al. |
| 6,020,220 A | 2/2000 | Gilleo et al. |
| 6,060,383 A | 5/2000 | Nogami et al. |
| 6,066,889 A * | 5/2000 | Jones et al. .................. 174/262 |
| 6,080,596 A | 6/2000 | Vindasius et al. |
| 6,081,026 A * | 6/2000 | Wang et al. ................. 257/700 |
| 6,110,760 A | 8/2000 | Medlen et al. |
| 6,221,769 B1 * | 4/2001 | Dhong et al. ............... 438/667 |
| 6,239,485 B1 * | 5/2001 | Peters et al. ................ 257/700 |
| 6,278,181 B1 * | 8/2001 | Maley ......................... 257/701 |
| 6,291,272 B1 * | 9/2001 | Giri et al. ................... 438/108 |

OTHER PUBLICATIONS

Sarah E. Leach et al. 1997 International Symposium on Advanced Packaging Materials, "Colamination Technology for electronic Packaging Applications" 38–41.

Catherine Gallagher et al. 1997 International Symposium on Advanced Packaging Materials, "Vertical Interconnect in Multilayer Applications Using Ormet®Conductive Composites" 35–37.

Ernsberger Proceedings of the First International Conference on Flex Circuits, Oct. 10–14, 1994, High Density Multilayer Interconnect Based on Adhesiveless Flex Circuits.

* cited by examiner

| | |
|---|---|
| ⊛ | Z-connection: Solder, Paste, Au/Sn, Cu/Sn... |
| ▢ | Signal Lines |
| ▥ | Signal Pad |
| ▦ | Power Layer |
| ▨ | Ground Layer |
| ▩ | Chip |
| 〰 | PCB |
| ▢ | Dielectric |
| ━ | Metal Core, P/G Layer |
| ▬ | Electrical Connector |

106

106

108

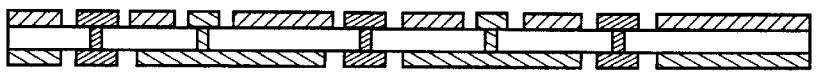
FIG. 11a
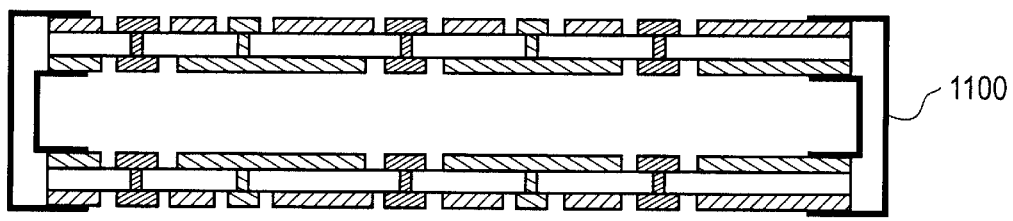
FIG. 11b
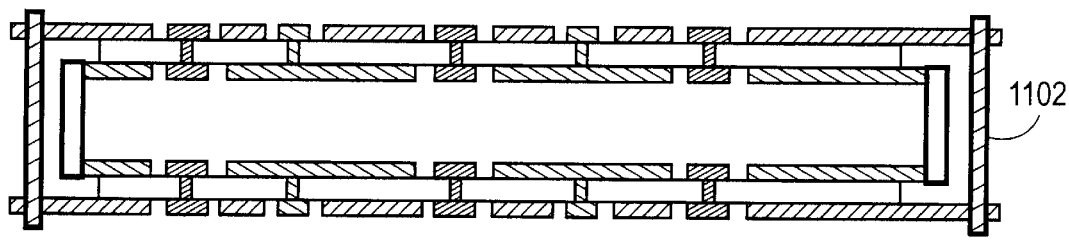
FIG. 11c
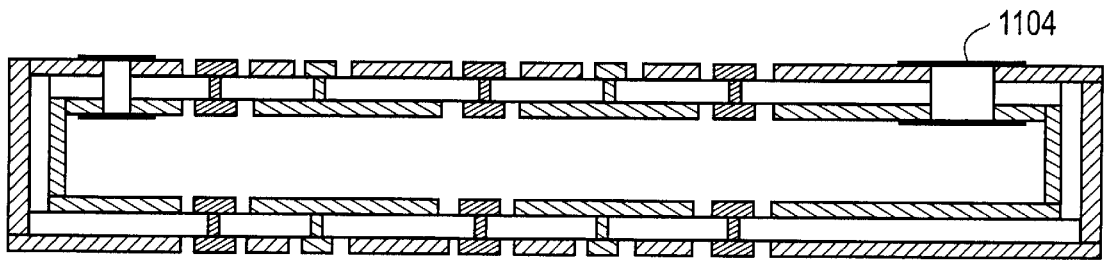
108
FIG. 11d

- ⊙ Z-connection: Solder, Paste, Au/Sn, Cu/Sn...
- ▭ Signal Lines
- ▦ Signal Pad
- ▦ Power Layer
- ▨ Ground Layer
- ▩ Chip
- ▩ PCB
- ▭ Dielectric
- ━ Metal Core, P/G Layer
- ▬ Electrical Connector Partial Area Interposer Structure

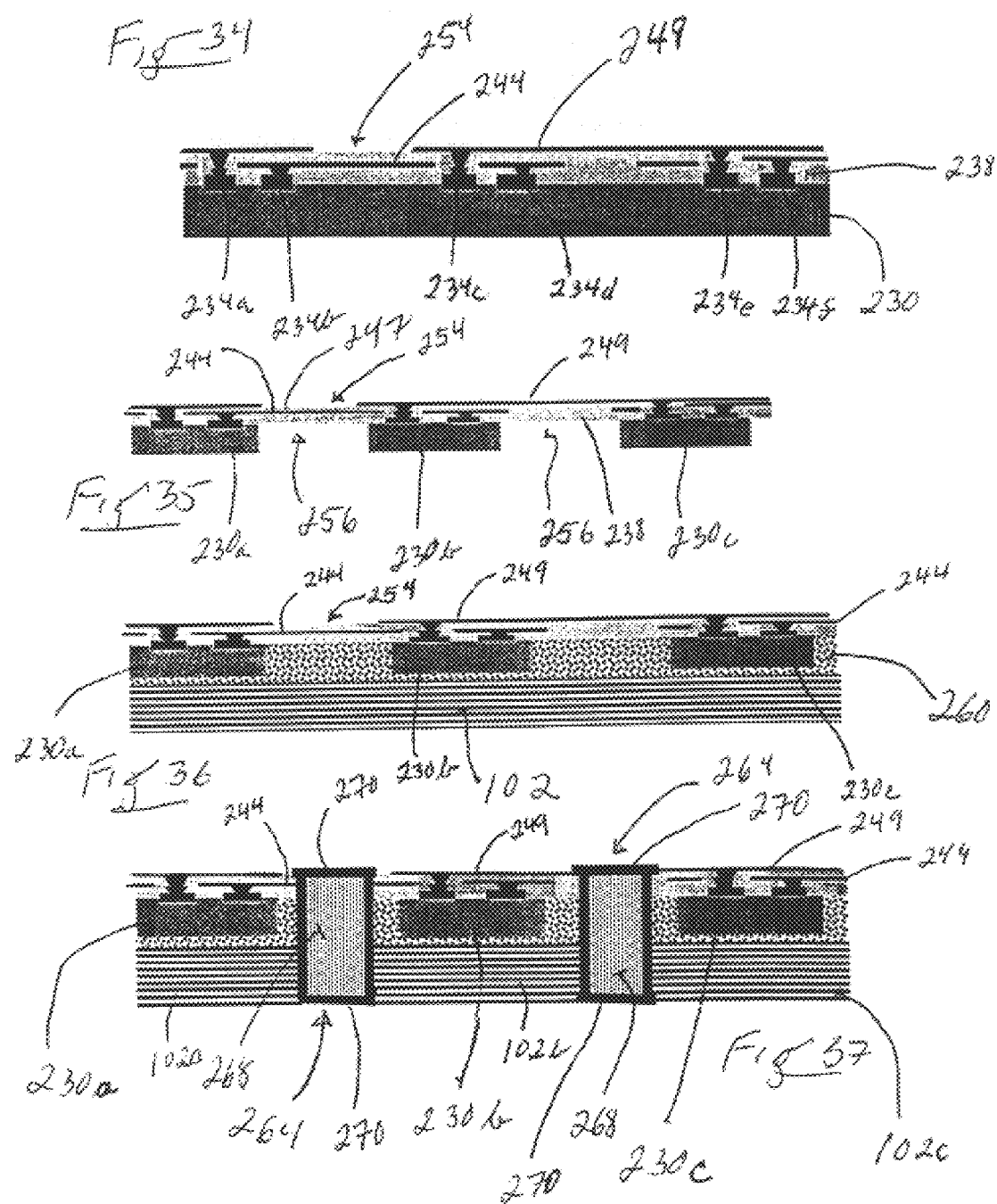

US 6,521,530 B2

COMPOSITE INTERPOSER AND METHOD FOR PRODUCING A COMPOSITE INTERPOSER

RELATED APPLICATIONS

This is a continuation-in-part application of co-pending U.S. patent application Ser. No. 09/315,785, filed May 20, 1999 now U.S. Pat. No. 6,239,485, entitled "REDUCED CROSS-TALK NOISE HIGH DENSITY SIGNAL INTERPOSER WITH POWER AND GROUND WRAP," and fully incorporated herein by reference thereto. U.S. patent application Ser. No. 09/315,785 is a continuation-in-part application of U.S. patent application Ser. No. 09/191,755, entitled "NOISE HIGH DENSITY SIGNAL INTERPOSER WITH POWER AND GROUND WRAP", filed Nov. 13, 1998, now U.S. Pat. No. 6,081,026, issued Jun. 27, 2000, assigned to the assignee of the present application and the contents of which is hereby incorporated by reference. Benefit of all earlier filing dates is claimed with respect to all common subject matter.

BACKGROUND OF THE INVENTION

1. Field of the Invention

Embodiments of the present invention relate to integrated circuit device packaging; more specifically, to an interposer substrate capable of reducing cross-talk between signal lines which is suitable for interconnecting integrated circuit chips to a printed circuit board or other substrate. Embodiments of the present inventions also provide a composite interposer and method for producing the composite interposer which may be placed between an integrated circuit and a printed circuit board.

2. Description of the Prior Art

An interposer is a structure used in the manufacture of single and multi-chip modules (SCMs or MCMs) to electrically connect one or more integrated circuit chips (ICs) to a printed circuit board or other substrate. The interposer provides power and ground connections between the board or substrate and the ICs. The interposer also provides signal paths between the IC chips and the board or substrate, and if desired, between different chips mounted on the interposer. An interposer thus provides a means of interconnecting signal, power, and ground lines between a substrate, an integrated circuit chip or chips, and ultimately a package containing the chip(s).

As the number of components in electronic devices increases and the size of the individual components decreases, there is an increase in the number and density of power, ground, and signal interconnections needed between individual ICs and the substrate to which the chips are connected. This means that the density of the interconnections which need to be included as part of an interposer also increases. However, problems arise in placing signal lines in close proximity to each other and to power supply lines when fabricating such an interposer. These problems include interference and cross-talk arising from coupling between the lines on a common layer or between signal lines on different signal layers, and capacitive coupling between the lines and the substrate which produces noise in the signals. In conjunction with the separation between the various lines, the dielectric constant of the substrate material thus plays an important role in reducing (or creating) these type of problems.

A patentability investigation was conducted to obtain the state of the art with respect to addressing these disadvantages of conventional approaches to packaging IC chips in MCMs, and the following U.S. Patents were discovered, all of which are incorporated herein by reference thereto: U.S. Pat. No. 5,404,044 to Booth et al.; U.S. Pat. No. 5,468,681 to Pasch; U.S. Pat. No. 5,558,928 to DiStefano et al.; U.S. Pat. No. 5,590,460 to DiStefano et al.; and U.S. Pat. No. 5,691,041 to Frakeny et al.

U.S. Pat. No. 5,404,044 to Booth et al discloses a method of fabricating a multi-layer integrated circuit interposer having at least one layer of polyimide with wiring patterns etched in metal on both its top and bottom surfaces. An adhesive layer is applied over the metal to cover both surfaces. Via holes are drilled through one adhesive layer surface and through the polyimide layer to the other adhesive surface. Metal is blanket sputtered to cover the adhesive surfaces, any exposed metal and via side walls. Conductive adhesive paste is screened onto both surfaces to at least partially fill the vias. Using the screened adhesive paste as a mask, the blanket metal is sub-etched away exposing the underlying adhesive layer.

U.S. Pat. No. 5,468,681 to Pasch discloses a preformed planar structure with through holes in registration with solder balls (pads) on chip(s) and substrate. Liquid flux selectively fills the through holes for delivery to the solder balls during soldering. The through holes aid in maintaining registration of the chip(s) and the substrate. The through holes are sized to establish a predetermined mechanical structure of solder joints formed by the solder balls when fused together. The preformed planar structure is disclosed has having a planar core and opposing planar faces. The core is taught to be formed by thermosetting organic resin, such as polyimide, or non-organic material, such as alumina, polished sapphire, beryllium oxide, aluminum or aluminum nitride. The planar faces of the preformed planar structure are formed of thermoplastic resin or thermosetting material, such as polyacetal, epoxy (epoxy resins) or polystyrene.

U.S. Pat. No. 5,558,928 to DiStefano et al discloses sheetlike interposers having preselected interconnect locations on both major surfaces and electrically conductive elements extending between interconnect locations on opposite surfaces. The interposer is taught as having a flowable dielectric material on its major surfaces except at its interconnect locations. Electrically conductive material on circuit panels, on the interposers, at their respective interconnect locations may be flowable. The circuit panels and interposers are stacked in a superposed relation so that each interposer is disposed between two circuit panels, with the major surfaces of the interposers and circuit panels confronting one another, and with interconnect locations on the confronting surfaces of the circuit panels and interposers being aligned with one another.

U.S. Pat. No. 5,590,460 also to DiStefano et al provides an interposer for making connections to electrical contacts on the surface of microelectronic elements such as a circuit panel, a semiconductor chip or other element having a contact-bearing surface. The interposer includes a body having a first major surface, such that the body defines horizontal directions parallel to the first major surface and vertical directions perpendicular to the first major surface. The interposer in U.S. Pat. No. 5,590,460 to DiStefano et al is further taught as having a plurality of conductors in the body, such as via conductors extending in or through the body, and including contacts at the first major surface of the body electrically connected to the conductors. Each contact is disclosed as extending over the first surface of the body in generally radially outwardly fashion from a central axis which is perpendicular to the first surface. Each contact has a periphery remote from the central axis. The contacts are adapted to deform so that the periphery of each contact will expand generally radially outwardly, away from the axis in response to a force applied to the contact directed toward the body.

U.S. Pat. No. 5,691,041 to Frankeny et al teaches a planar interposer of flexible dielectric material having a multiplicity of vias or pads covered with dendrites, which vias or pads are distributed in a pattern substantially conforming to an electronic ball grid array device. A rigid cap with a planar surface is aligned to be substantially coplanar with the surface of the ball grid array device. U.S. Pat. No. 5,691,041 to Frankeny et al also teaches a means for aligning a pattern of balls on a surface of the ball grid array device with the planar interposer and with a pattern contact region on a board, and means for translating the rigid cap to compress the ball grid array device, the interposer, and the contact regions of the board adequately to cause dendrite penetration into the ball grid array device balls and the contact regions on the board.

Disadvantages of conventional approaches to packaging IC chips in MCMs arise from the method used to deliver power to the chips. This problem results because power lines are typically routed through the same substrate which is utilized to carry signals to and from the chip. The power feedthroughs will compete for space with the signal I/O lines. This will further increase the problems caused by densely packed signal traces. Another important disadvantage is that the thinness of the substrates used in traditional multichip modules results in the power feeds to the IC chips having a relatively high impedance. This results in undesired noise, power loss, and excess thermal energy production. These problems are relevant to the routing of both power and signal lines though an interposer substrate.

Therefore, what is desired and what has been invented is a composite interposer for interconnecting a single integrated circuit chip to a substrate, or for interconnecting a plurality of chips to each other and to a substrate, which addresses the inherent and noted disadvantages of conventional structures. What is further needed and what has been invented is a method for fabricating a composite interposer.

SUMMARY OF THE INVENTION

Embodiments of the present invention are directed to an interposer for providing power, ground, and signal connections between an integrated circuit chip or chips and a substrate. The interposer includes a signal core and external power/ground connection wrap. The two sections may be fabricated and tested separately, then joined together using z-connection technology. The signal core is formed from a conductive power/ground plane positioned between two dielectric layers. A patterned metal layer is formed on each dielectric layer. The two metal layers are interconnected by a through via or post process. The conductive power/ground plane functions to reduce signal cross-talk between signal lines formed on the two patterned metal layers.

The power/ground wrap includes an upper substrate positioned above the signal core and a lower substrate positioned below the signal core. The upper and lower substrates of the power/ground wrap are formed from a dielectric film having a patterned metal layer on both sides, with the patterned layers connected by a through via or post process. The two power/ground wrap substrates may be formed separately or from one substrate which is bent into a desired form (e.g., a "U" shape). The two power/ground substrates are maintained in their proper alignment relative to the signal core and to each other by edge connectors which are also connected to the signal core's intermediary power/ground plane.

The top layer of the upper power/ground wrap substrate and the bottom layer of the lower power/ground wrap substrate serve as the ground layer. The ground layer includes isolated pads for signal and power interconnections between the base substrate on which the interposer is mounted and the chip(s) mounted on top of the interposer. The bottom layer of the upper substrate and the top layer of the lower substrate of the power/ground wrap serve as the power layer and include isolated pads for signal interconnections. With an integrated circuit chip or chips connected to the upper layer of the top substrate of the power/ground wrap and a printed circuit board or other mounting substrate connected to the bottom layer of the lower substrate of the wrap, the inventive interposer provides a set of high density and electrically isolated signal, power, and ground interconnections having reduced cross-talk between signal lines.

Embodiments of the present invention are further directed to a method for fabricating a composite interposer comprising disposing a silicon layer on a substrate; selectively etching the silicon layer down to the substrate to develop silicon openings with a silicon profile, and to expose part of the substrate; and forming vias through the exposed part of the substrate. The method for fabricating further includes filling the vias and the silicon openings with a filler material (e.g., high-aspect-ratio-capable photodefinable epoxy) to form filled silicon openings and filled vias; forming first openings through the filled silicon openings and through the filled vias; and forming second openings through filler material to expose semiconductor devices on the silicon layer. The method further comprises interconnecting electrically, through the first openings and through the second openings, the exposed semiconductor devices with pads disposed against a bottom of the substrate. Each of the pads is selected from the group of pads consisting of voltage pads, ground pads, and signal pads. Selectively etching the silicon layer down to the substrate additionally includes forming a plurality of spaced silicon layers supported by the substrate. The first openings may be filled with a dielectric filler after interconnecting electrically the exposed semiconductor devices with the pads. The filler material may include an aspect ratio ranging from about 2:1 to about 40:1.

In one embodiment of the present invention a method is provided for fabricating a composite interposer comprising disposing a plurality of conductive elements (e.g., devices including semiconductive devices, metal pads, etc.) on a top of a silicon layer, leaving part of a top of the silicon layer exposed; disposing a dielectric material over the conductive elements and the exposed top of the silicon layer; and selectively removing dielectric material from over the conductive elements. Voltage or power planes and ground planes may then be formed. The method for fabricating a composite interposer additionally comprises selectively removing silicon from a bottom of the silicon layer to form silicon openings and to expose part of the dielectric material; filling the silicon openings with a polymer filler, leaving a polymer filler layer on the bottom of the silicon layer; securing a substrate to the polymer filler layer; and forming vias through the substrate, the polymer filler and the dielectric material. The vias may then be metal plated. The method additionally comprises testing the silicon layer including the conductive elements to determine if any of the conductive elements are defective. The forming of a voltage plane includes depositing a metal voltage layer on the dielectric material and coupling same to the exposed conductive elements. The forming of a ground plane comprises forming a plurality of vias in the second dielectric layer to produce a residual second dielectric layer and to re-expose the exposed metal-filled conductive elements; and depositing a metal ground metal on the residual second dielectric layer and in the vias in the second dielectric layer to couple the metal-filled conductive elements to the metal ground metal. A portion of the metal ground layer may be removed to produce an exposed second dielectric layer. Forming the vias includes forming vias through the produced exposed second dielectric layer. The plated vias may be filled and capped. The conductive element may be a metal pad or a semiconductor device (e.g., a capacitor).

In another embodiment of the present invention, a method is provided for fabricating a composite interposer disposing a plurality of conductive elements (e.g., devices including semiconductive devices, metal pads, etc.) on top of a silicon layer, leaving part of a top of the silicon layer exposed; disposing a dielectric material over the conductive elements and the exposed top of the silicon layer; and selectively removing silicon from a bottom of the silicon layer to form silicon openings and to expose part of the dielectric material. The method for fabricating a composite interposer additionally comprises filling the silicon openings with a polymer filler, leaving a polymer filler layer on the bottom of the silicon layer; securing a substrate to the polymer filler layer; selectively removing dielectric material from over the conductive elements; and forming vias through the substrate, the polymer filler, and the dielectric material. The vias may then be metal plated. The conductive elements may be tested for defectiveness.

These provisions together with the various ancillary provisions and features which will become apparent to those skilled in the art as the following description proceeds, are attained by the methods and composite interposer of the present invention, preferred embodiments thereof being shown with reference to the accompanying drawings, by way of example only, wherein:

BRIEF DESCRIPTION OF THE DRAWINGS

FIGS. 11(a) to 11(d) show a process flow for yet another method of fabricating the power/ground wrap which is part of an embodiment of the interposer of the present invention.

FIGS. 31–37 illustrate a process flow of a method for fabricating yet another embodiment of the composite interposer.

DETAILED DESCRIPTION OF PREFERRED EMBODIMENTS OF THE INVENTION

The present invention is directed to an interposer designed to provide signal, power, and ground connections between an integrated circuit chip and an underlying printed circuit board or substrate. The inventive interposer provides the following several advantages over conventional structures:

(1) The density of the interposer signal routing lines can be higher than for conventional interposers because there are no power and ground line connects which pass through the signal core. In this regard, the gap between vias which connect signal lines is increased by approximately a factor of the square root of 2 compared to the line density on a chip. This means that the signal line density on the interposer can be increased relative to that on a chip which includes power and ground lines:

(2) Different technology and processes can be used to fabricate the signal core and the power/ground wrap. Since the pattern size of the power/ground wrap is larger, a lower cost process (e.g., subtractive) can be used:

(3) The signal core and power/ground wrap can be fabricated and tested separately. This is advantageous because the cycle time and yield of parallel processes will be better than for sequential processes:

(4) The power/ground plane positioned between the signal layers on either side of the signal core acts to reduce the cross-talk between signal lines on the two layers;

(5) The majority of the power/ground vias can be replaced by an edge connection. If a laser is used to drill the vias, the need for fewer vias will reduce the cost of this aspect of the fabrication: and (6) If a decoupling capacitor or termination resistor is needed, it (they) can be connected externally through the edge connector of the power/ground layers in one direction and the edges of the signal layers in another direction. This will provide a three-dimensional package.

As the inventors have realized, not all of the connections (power, ground, signal, resistor, capacitor, etc.) required to connect an IC chip to a substrate need to pass through an intermediary interposer or be distributed on the same substrate. As a result, the signal traces can be increased in density and the fabrication costs can be reduced by using the inventive structure.

Figure 1:
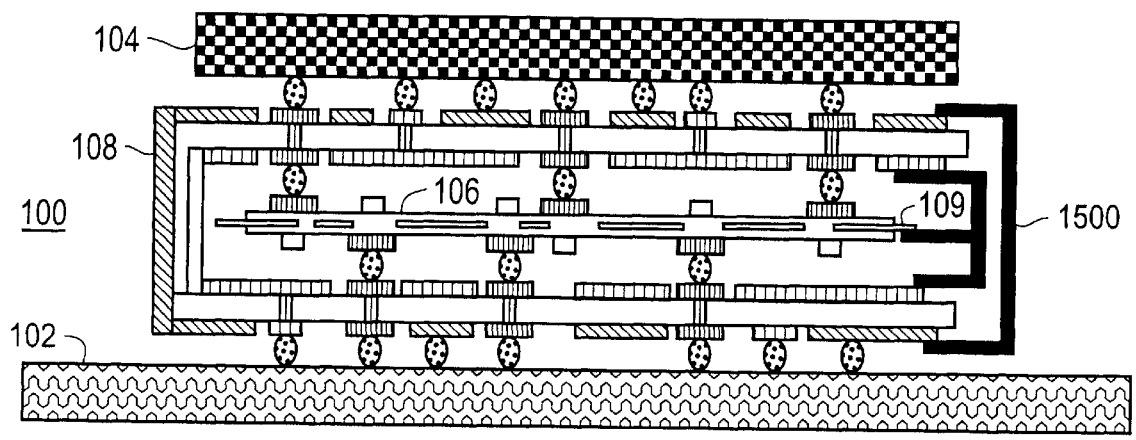
FIG. 1 is a schematic cross-sectional view of one embodiment of the signal interposer of the present invention positioned between a printed circuit board and an integrated circuit chip.

FIG. 1 is a schematic cross-sectional view of one embodiment of the reduced cross-talk signal interposer 100 of the present invention, and is shown positioned between a printed circuit board 102 and an integrated circuit chip 104. The legend for the figure identifies some of the components of the complete structure. As shown in the figure, interposer 100 includes two primary sections; a signal core 106 and a power/ground wrap 108. The two sections can be fabricated and tested separately and then joined together using a z-connection technology, e.g., solder bumps, anisotropic conducting polymers, or another suitable method. This reduces the cycle time for manufacturing and testing of the structure, and increases the types of processing techniques which may be used to form the different parts of the final structure.

As shown in the figure, in accordance with the present invention, power and ground interconnections are routed between the mounting substrate 102 and the chip(s) 104 without passing through the signal core 106. On the other hand, the signal lines are routed between the mounting substrate 102 and the chip(s) 104 by passing only through the signal core. This architecture provides electrical isolation between the power, ground, and signal interconnections (and hence reduces noise and other problems caused by capacitive coupling between lines) while increasing the density of signal lines which can be connected between the substrate and chip(s). Signal core 106 includes a power/ground layer 109 positioned between signal layers which are on either side of that substrate and together form the basis for the signal core. Power/ground layer 109 acts to reduce cross-talk between signal lines on the same or different signal layers of signal core 106.

Figure 2:
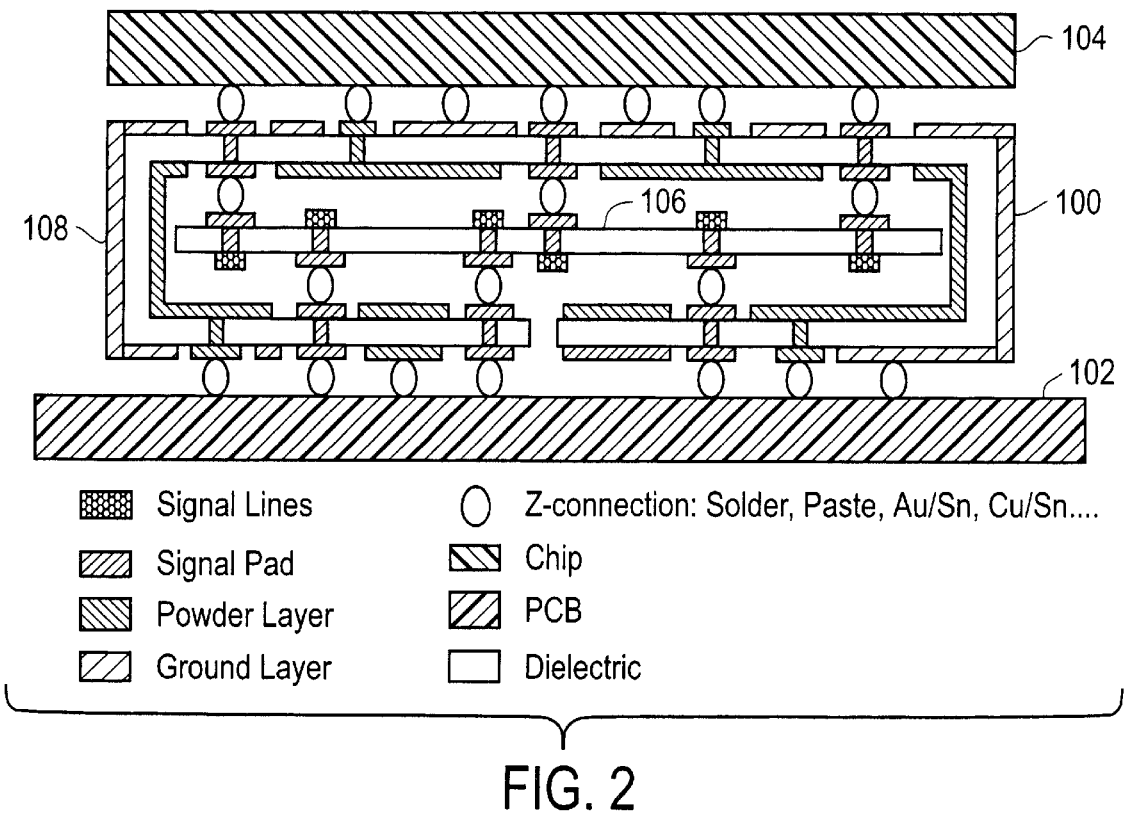
FIG. 2 is a schematic cross-sectional view of another embodiment of the signal interposer of the present invention, and is shown positioned between a printed circuit board and an integrated circuit chip.

As shown in FIG. 1, edge connectors 1500 may be used to electrically connect different ground layers (e.g., the lower surface of the lower power/ground substrate to the upper surface of the upper power/ground substrate), different power layers (e.g., the upper surface of the lower power/ground substrate to the lower surface of the upper power/ground substrate), or the power/ground layer of the signal core to other ground or power layers of the interposer. Although a single set of edge connectors 1500 is shown in the figure, note that if the upper and lower power/ground substrates are fabricated separately (rather than formed from a flexible substrate which is bent into a "U" shape), then a set of connectors 1500 may be used at both ends of the two power/ground substrates. FIG. 2 is a schematic cross-sectional view of another embodiment of the signal interposer 100 positioned between the printed board 102 and the integrated circuit chip 104.

Figure 4:
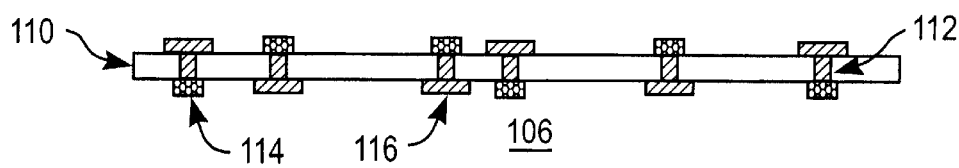
FIG. 4 is a schematic cross-sectional view of another embodiment of the signal core which is part of an embodiment of the interposer of the present invention.
Figure 3:
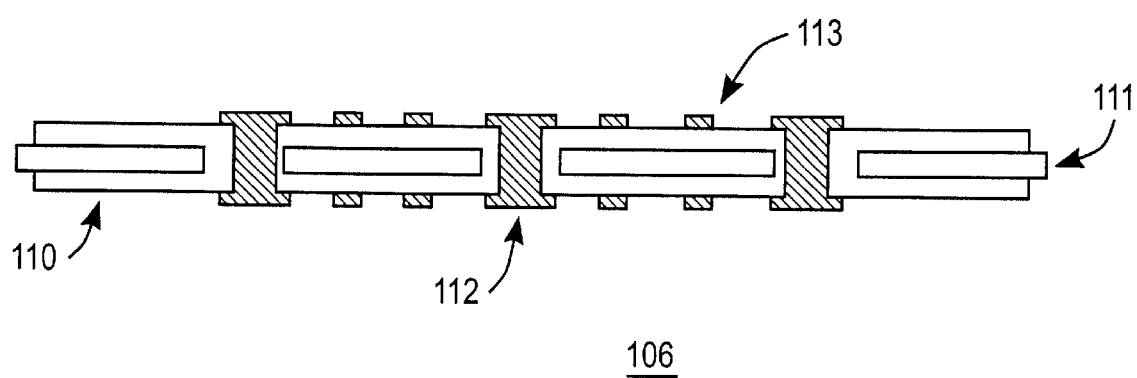
FIG. 3 is a schematic cross-sectional view of an embodiment of the signal core which is part of certain embodiments of the interposer of the present invention.
Figure 6:
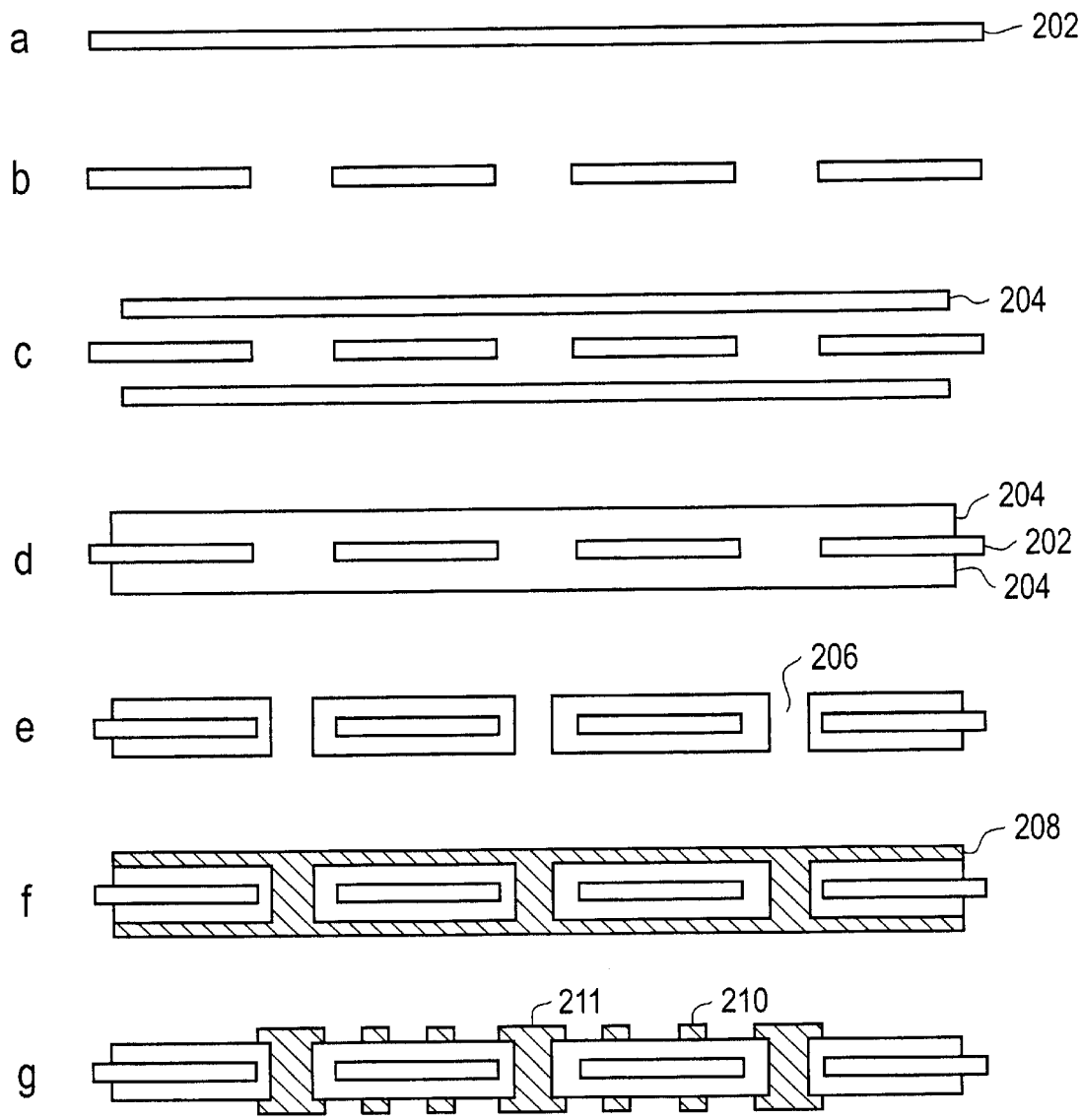
FIGS. 6(a) to 6(g) show a process flow for a method of fabricating the signal core which is part of an embodiment of the interposer of the present invention.

FIG. 3 is a schematic cross-sectional view of one embodiment of the circuit signal core 106 which is part of the interposer of the present invention. Signal core 106 is formed from a conductive core or substrate 111 through which holes or apertures are formed. Conductive core 111 is typically formed from a suitable metal and serves as both a power/ground layer for the interposer and as a reinforcing structure for the signal layers of signal core 106. A dielectric film 110 (e.g., Polyimide, BT, etc.) is arranged on both sides of conductive core 111. Signal lines 113 are defined on a patterned metal layer formed on each of the two dielectric film layers. The two patterned metal layers are interconnected as desired by either a through via or a conductive post structure 112, with the through via or conductive post being suitable for interconnecting the signal core to other layers of the interposer structure, or to the mounting substrate or integrated circuit chips. Referring now to FIG. 4 for another embodiment of the signal core 106, the two metal layers are interconnected as desired by either a through via or the conductive post structure 112. Signal core 106 may be a free standing film or it maybe fabricated from a film on top of a supporting ring formed by etching the center part of the dielectric substrate.

Each dielectric layer 110 is typically 25 to 50 microns thick. As noted, the patterned metal layers include signal lines 113 and vias/signal pads 112. Signal lines 113 are typically 20 microns wide with a pitch of 20 microns. The size/pitch can be reduced further if desired, e.g., to a width of 5 microns and pitch of 7.5 microns. Signal pads 112 are used to interconnect signals between layers of the overall mounting substrate-interposer-chip structure. Signal pads 112 are typically 100 microns wide with a pitch of 350 microns.

Figure 5:
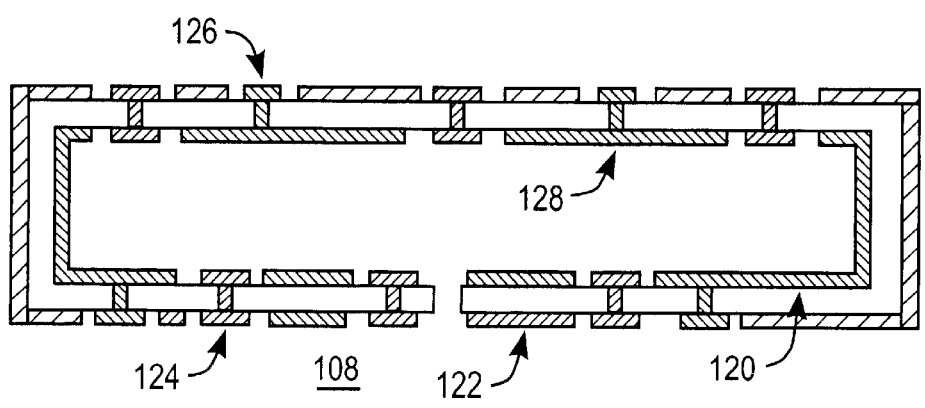
FIG. 5 is a schematic cross-sectional view of the power/ground wrap which is part of an embodiment of the interposer of the present invention.

Referring now to FIG. 5, there is seen a schematic cross-sectional view of power ground wrap 108 which is part of embodiments of the interposer of the present invention. Power ground wrap 108 is formed from a dielectric film 120 (e.g. Polyimide, Bt, etc.) on both sides of which is patterned a metal layer. The two metal layers are interconnected as desired by either a through via or conductive post. Substrate 120 is formed into the shape shown in the figure, i.e., a box-shaped structure having a space between an upper and lower substrate. A ground layer 122 is formed from the metal layer arranged on the top outer surface of dielectric substrate 120. Ground layer 122 includes electrically isolated pads for signal 124 and power 126 interconnections between signal core 106, power ground wrap 108, chip 104, and substrate 102. A power layer 128 is formed from the metal layer arranged on the bottom inner surface of dielectric substrate 120. Power layer 128 includes electrically isolated pads for signal interconnections between signal core 106, power/ground wrap 108, chip 104, and substrate 102.

Dielectric layer 120 of ground wrap 108 is typically 25 to 50 microns thick. Ground layer 122 provides a continuous ground plane formed from a 5 to 20 micron thick layer of copper, for example. Ground layer 122 includes isolation rings to permit power and signal lines to be fed through the layer. The signal 124 and power 126 pads formed on ground layer 122 are typically 100 microns wide with a pitch of 250 microns. Note that the size or pitch may be increased if desired since a ground connection via is not needed.

Power layer 128 of the ground wrap 108 provides a continuous plane formed from a 5 to 20 micron thick layer of copper, for example and includes isolation rings to permit signal lines to be fed through the layer. The signal pads formed on power layer 128 are typically 100 microns wide with a pitch of 250 microns. With the signal core of FIG. 4 inserted between the upper and lower substrates of the power/ground wrap, signal connections may be made between the base substrate (element 102 of FIG. 2), the signal core, and the integrated circuit chip(s) in isolation from the power and ground connections between the base substrate and the chip(s). This permits an increase in signal line density and minimization of signal path lengths while achieving a high degree of electrical isolation between the different types of lines. It should be noted that in the design for power/ground wrap 108, the ground connections are arranged on the outside surfaces of the wrap, while the power connections are on the inside surfaces. This acts to isolate the power and ground connections from each other, as well as from the signal connections which pass through the signal core.

FIGS. 6(a) to 6(g) show a process flow for one preferred method of fabricating the signal core which is part of the reduced cross-talk interposer of embodiments of the present invention. In the process flow shown in FIG. 6, the metal layers on the two sides of the core substrate are interconnected by a through via. As shown in the figures, the process flow begins with a conductive layer, which may be formed from a suitable metal 202 (FIG. 6(a)). Holes or apertures are formed in layer 202 at the positions where through vias or conductive posts will later be formed (FIG. 6(b)). A dielectric layer 204 is then formed on each surface of conductive layer 202. Dielectric layers 204 may be laminated onto each surface of layer 202 (FIGS. 6(c) and 6(d)). Vias 206 are formed through dielectric layers 204 in the locations corresponding to the predefined apertures in conductive layer 202 (FIG. 6(e)). Vias 206 may be formed by means of a laser drill or plasma etch process. Vias 206 are then metallized and a seed layer 208 is deposited on the surface of each dielectric layer 204 using electroless plating, direct plating, sputtering, or another suitable process (FIG. 6(f)). Seed layer 208 is then built up to form a metal layer of desired thickness which is patterned as desired to form signal lines 210 and signal pads 211 (FIG. 6(g)). The metal signal line layer may be patterned using either an additive process (e.g., electrolytic plating) or a subtractive process. It is to be noted that an additive process may be preferable for some of the steps to achieve metal patterning of 5–10 microns width and a pitch of 5–10 microns. If the line width or pitch can be larger, a subtractive process may be used.

Figure 7A:
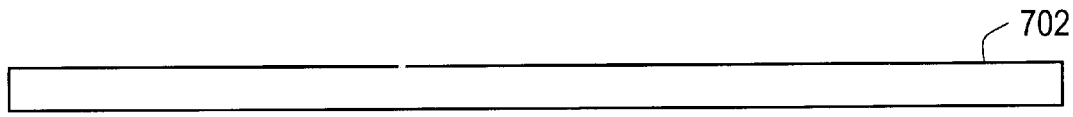
FIGS. 7(a) to 7(f) show a process flow for a method of fabricating the signal core which is part of an embodiment of the interposer of the present invention.
Figure 7B:
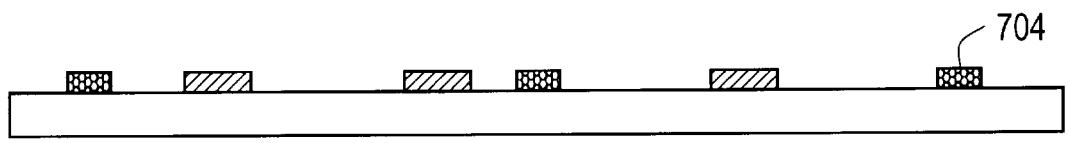
Figure 7C:
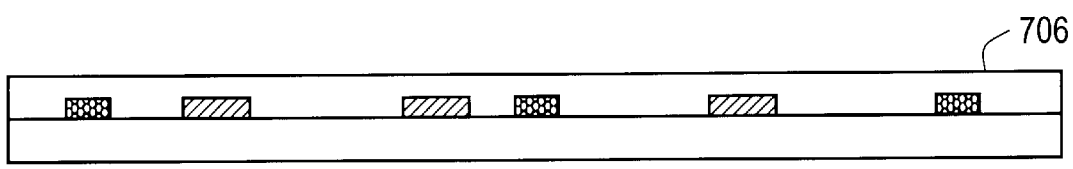
Figure 7D:
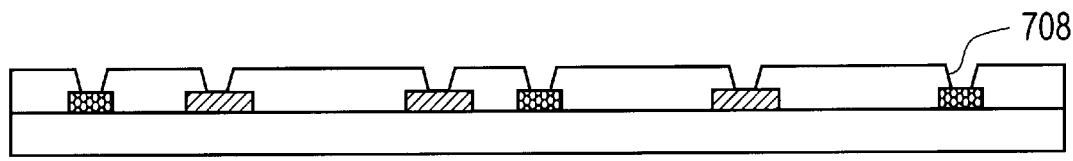
Figure 7E:
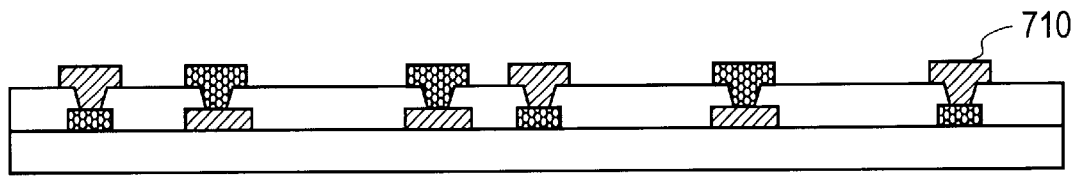
Figure 7F:
Figure 8A:
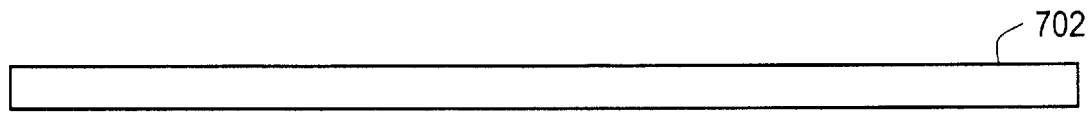
FIGS. 8(a) to 8(g) show a process flow for another method of fabricating the signal core which is part of an embodiment of the interposer of the present invention.
Figure 8B:
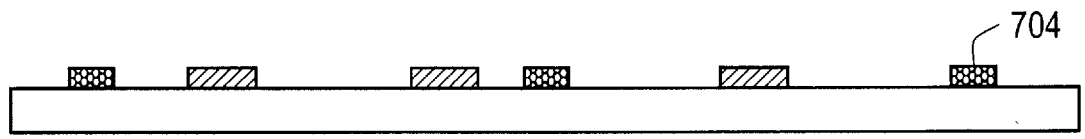
Figure 8C:
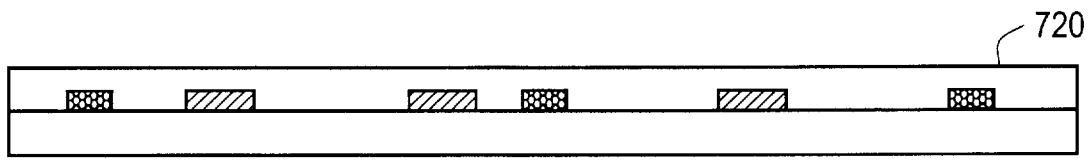
Figure 8D:
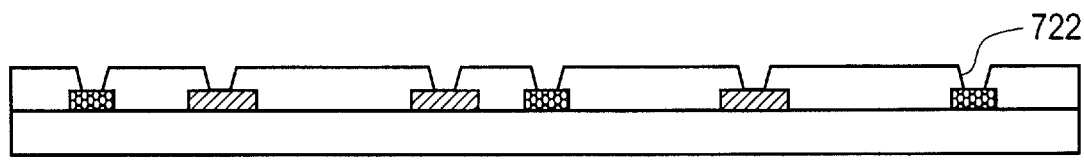
Figure 8E:
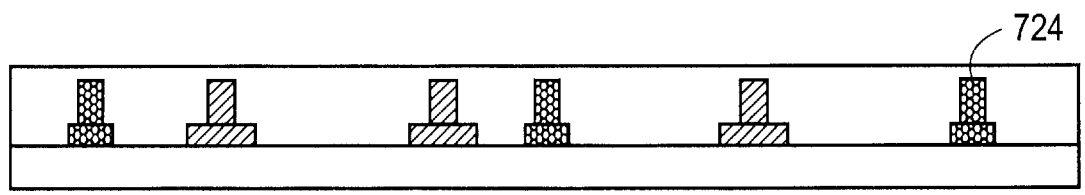
Figure 8F:
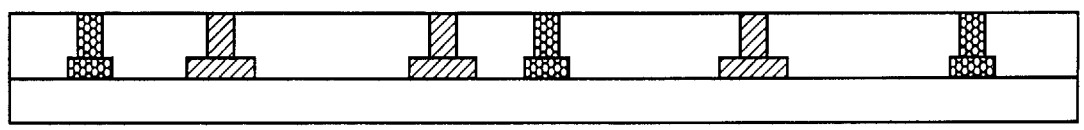
Figure 8G:
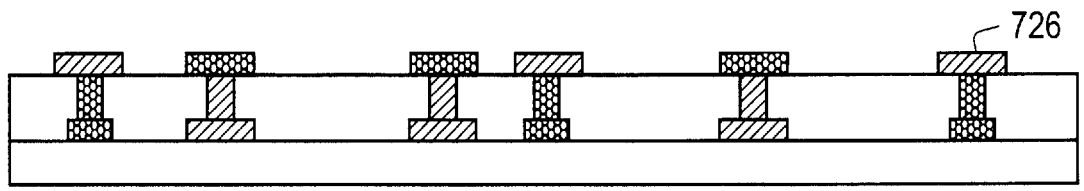
Figure 9A:
FIGS. 9(a) to 9(d) show a process flow for a further method of fabricating the signal core which is part of an embodiment of the interposer of the present invention.
Figure 9B:
Figure 9C:
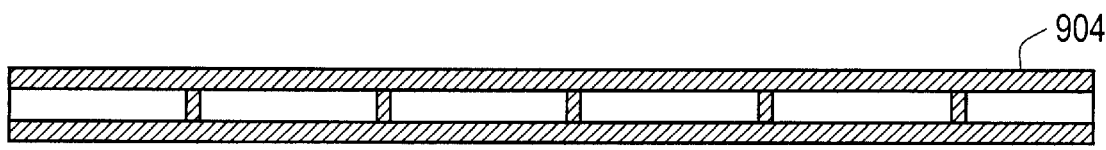
Figure 9D:
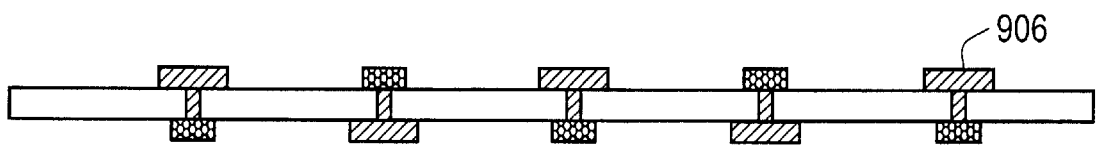
Figure 10A:
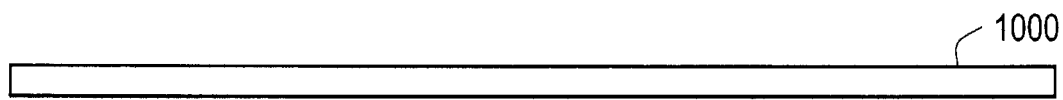
FIGS. 10(a) to 10(e) show a process flow for an additional method of fabricating the power/ground wrap which is part of an embodiment of the interposer of the present invention.
Figure 10B:
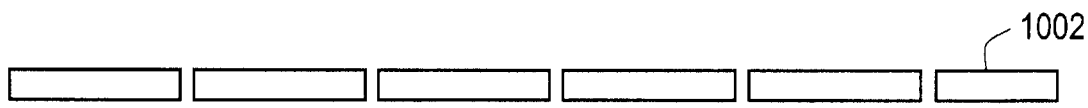
Figure 10C:
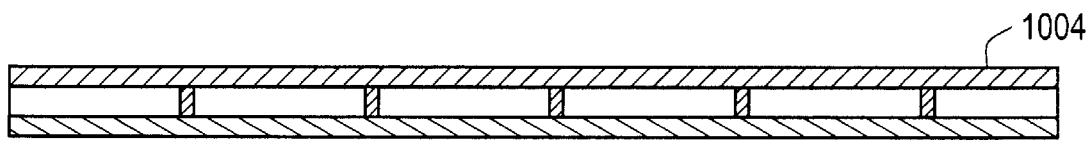
Figure 10D:
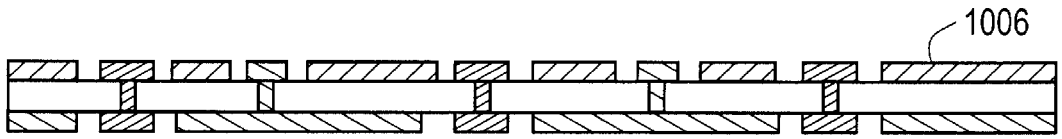
Figure 10E:
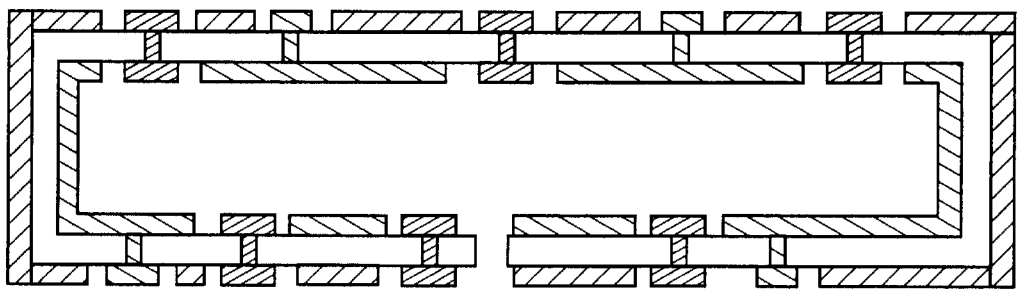

Referring now to FIGS. 7(a) to 7(f) show a process flow for another method of fabricating another embodiment of the signal core which is part of embodiments of the interposer of the present invention. In the process flow shown in FIG. 7, the metal layers on the two sides of the dielectric substrate are interconnected by a through via. As shown in the figures, the process flow begins with a sacrificial substrate 702 (FIG. 7(a)). A metal layer 704 is then formed over the substrate and patterned as desired (FIG. 7(b)). A dielectric layer 706 (which will become the substrate for the finished signal core) is then formed over the patterned metal layer (FIG. 7(c)). The locations for the through vias are then defined on the top dielectric layer 706, and the vias 708 are formed by a suitable process, e.g., etching or drilling through the dielectric layer (FIG. 7(d)). A plating or metallization step is then used to fill the vias with a conductive material 710 (FIG. 7(e)). The initial substrate (as shown in FIG. 7(a)) is then removed, typically by using an etch process, leaving the signal core 106 (FIG. 7(f)). The signal core may also be peeled off of the substrate. It is to be noted that an additive process is preferable for steps illustrated in FIG. 7(b) and FIG. 7(c) to achieve metal patterning of 5–10 microns width and a pitch of 5–10 microns. If the line width or pitch can be larger, a subtractive process may be used. In the step of FIG. 7(d), the vias can be formed by either laser drilling or plasma etch. As noted, in the step of FIG. 7(f), the signal core is removed from the sacrificial substrate.

FIGS. 8(a) to 8(g) show a process flow for yet another method of fabricating another embodiment of the signal core which is part of embodiments of the interposer of the present invention. In the process flow shown in FIG. 8, the metal layers on the two sides of the dielectric substrate are interconnected by a conductive post. As shown in the figures, the process flow begins with a substrate 720 (FIG. 8(a)). A metal layer 704 is then formed over the substrate and patterned (FIG. 8(b)). A resist layer 720 is then formed over the patterned metal layer (FIG. 8(c)). The top resist layer is then patterned to form the locations 722 for the posts (FIG. 8(d)). The conductive posts 724 are then formed by a suitable electrolytic deposition process. A dielectric layer is then formed over the posts (FIG. 8(e)). A chemical-mechanical polishing process is then used to planarize the top dielectric layer and level the posts (FIG. 8(f)). Finally, a metallization step is used to form conductive contacts 726 on the tops of the posts FIG. 8(g)). It should be noted that an additive process is preferable for steps illustrated in FIG. 8(b) and in FIG. 8(g) to achieve metal patterning of 5–10 micron line widths and 5–10 micron pitch. If the line width or pitch can be larger, a subtractive process may be used. In the step shown in FIG. 8(f), a chemical mechanical polishing (CMP) may be used to expose the post. In the step shown in FIG. 8(g), the signal core 106 is removed from the sacrificial substrate shown in FIG. 8(a).

FIGS. 9(a) to 9(d) illustrate a process flow for another method of fabricating the signal core 106 which is part of the interposer of the present invention. The process flow shown in FIG. 9 is, like that of FIG. 7, one in which the metal layers on the two sides of the dielectric substrate are interconnected by a through via. The process begins with a dielectric substrate 900 (FIG. 9(a)). Holes 902 for the vias are formed in the desired locations by laser drilling or a plasma etch (FIG. 9(b)). The vias are filled with a conductive material and a metal layer 904 is formed on the top and bottom of the substrate by electroless plating or direct plating, followed by electrolytic plating (FIG. 9(c)). The metal layers are then patterned to form pads 906 on the metal layers which are interconnected by the through vias (FIG. 9(d)). It is to be noted that it is preferable to use an additive process for the step illustrated in FIG. 9(d) to achieve metal patterning of 5–10 micron line widths and 5–10 micron pitch. If the line width or pitch can be larger, then a subtractive process may be used.

FIGS. 10(a) to 10(e) show a process flow for an additional method of fabricating the power/ground wrap 108 which is part of the interposer of the present invention. The fabrication process shown begins with a dielectric substrate 1000 (FIG. 10(*a*)). Through vias 1002 are formed in the substrate at the desired locations (FIG. 10(*b*)). The vias may be formed by a laser drill, plasma etching, or another suitable method. The vias are then filled with a conductive material, and a conductive layer 1004 is formed on the upper and lower surfaces of the substrate (FIG. 10(*c*)). The conductive material may be applied by an electroless and/or electrolytic plating process. Metal chemical vapor deposition (MCVD) or another suitable process may also be used. The conductive layers on the upper and lower surfaces of the substrate are then patterned to form the desired power, ground, and signal connections 1006 (FIG. 10(*d*)). A subtractive process may be used to form the patterned layers. Since substrate 1000 is a thin-film, it may be bent to form the structure of FIG. 10(*e*) from that of FIG. 10(*d*)).

Referring now to FIGS. 11(*a*) to 11(*d*) for illustrating a process flow for a further method of fabricating the power/ground wrap 108 which is part of the interposer of the present invention. In this method, the need for precise alignment between the top, bottom, and sides of the wrap and the signal core (which is present in the method described with reference to FIG. 10) is lessened. Instead, in this process, the top and bottom pieces of the ground/power layers are fabricated as separate substrates and assembled to the signal core separately. As shown in FIG. 11(*a*), the upper and lower surfaces of the power/ground wrap are formed as separate substrates using the process described with reference to FIGS. 10(*a*) to 10(*d*). Edge connectors 1101 and 1102 are used to interconnect the power/ground planes between the two substrates as needed (FIGS. 11(*b*), 11(*c*)). If a flexible substrate is used, the lower power/ground layer can be bent and plane solid connections 1104 used to connect to the upper power/ground layer (FIG. 11(*d*)).

Figure 12:
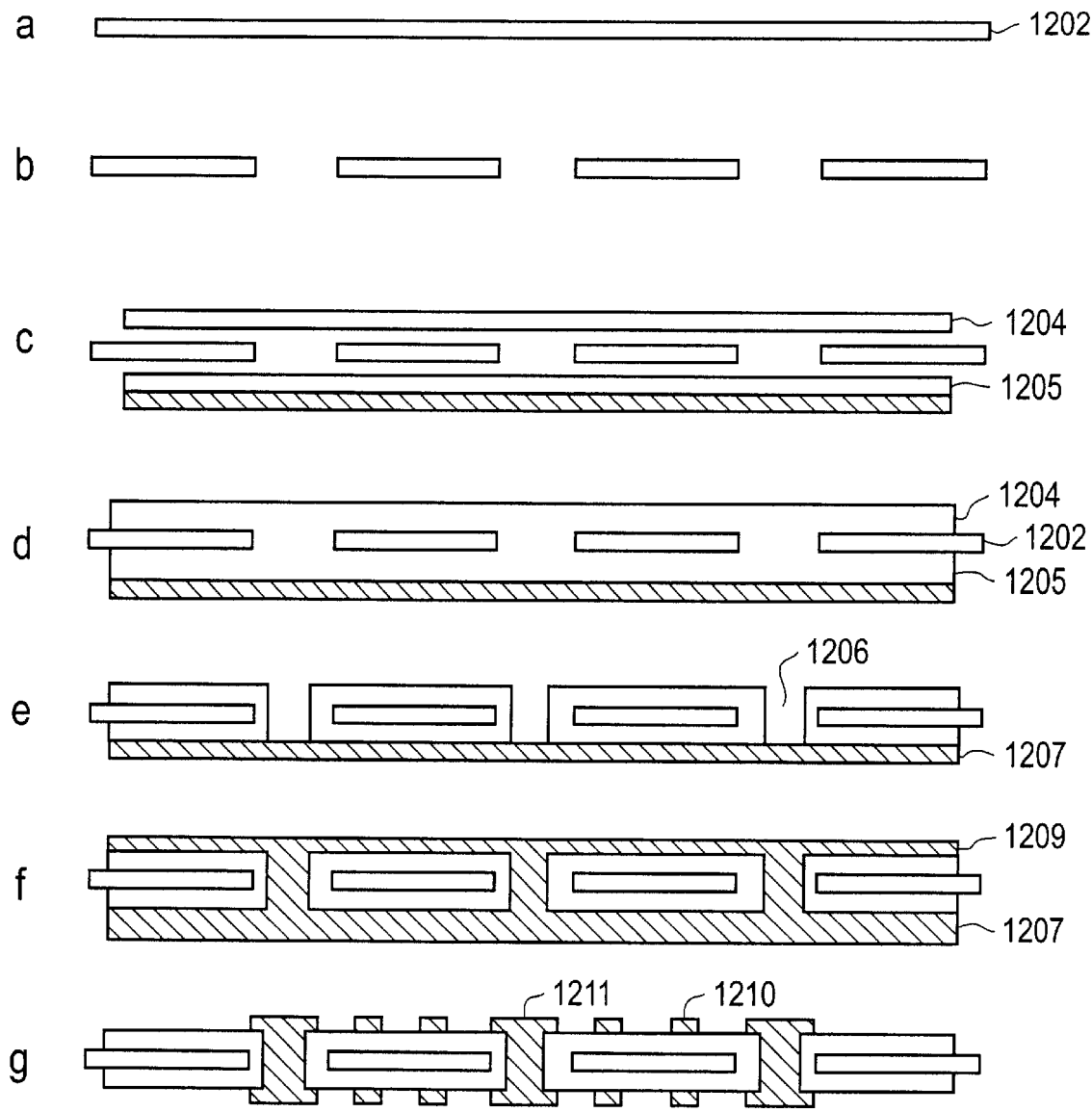
FIGS. 12(a) to 12(g) show a process flow for another method of fabricating the signal core which is part of an embodiment the interposer of the present invention.

FIGS. 12(*a*) to 12(*g*) illustrate a process flow for an additional method of fabricating the signal core which is part of the reduced cross-talk interposer of the present invention. In the process flow shown in FIG. 12, a conductive layer 1202 again has holes or apertures formed through it at desired locations (FIGS. 12(*a*) and 12(*b*)). A dielectric layer 1204 is formed (e.g., laminated) onto one surface of conductive layer 1202. A dielectric having a previously formed metallized surface or layer 1205 is then laminated onto the other surface of conductive layer 1202 (FIGS. 12(*c*) and 12(*d*)). Vias 1206 are formed through dielectric layers 1204 in the locations corresponding to the predefined apertures in conductive layer 1202 (FIG. 12(*e*)). Vias 1206 may be formed by means of a laser drill or plasma etch process. Metallized layer 1207 of the combined dielectric and metal layer structure 1205 is used to provide an electrical connection for plating of vias 1206 and formation of a conductive layer 1209 on dielectric layer 1204 (FIG. 12(*f*)). A method for performing this step is described in U.S. patent application Ser. No. 09/275,543, entitled "Method of Fabrication of Substrate with Via Connection", filed Mar. 24, 1999, assigned to the assignee of the present invention and the contents of which is hereby incorporated by reference.

Conductive layers 1207 and 1209 are then patterned as desired to form signal lines 1210 and signal pads 1211 (FIG. 12(*g*)). The seed layers may be patterned using either an additive process (e.g., electrolytic plating) or a subtractive process. Note that an additive process may be preferable for some of the steps to achieve metal patterning of 5–10 microns width and a pitch of 5–10 microns. If the line width or pitch can be larger, a subtractive process may be used.

Figure 13:
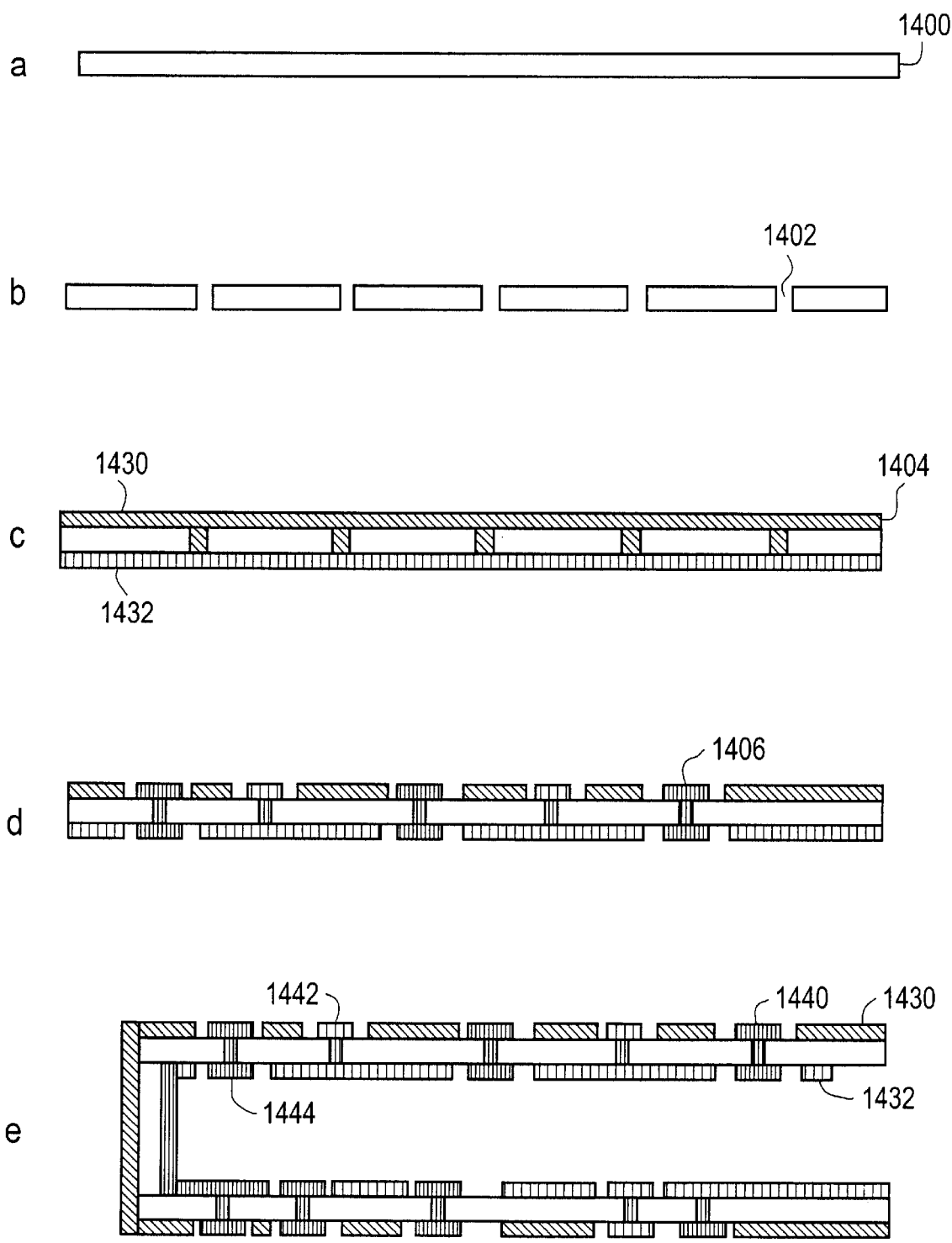
FIGS. 13(a) to 13(e) show a process flow for yet another method of fabricating the power/ground wrap which is part of an embodiment the interposer of the present invention.

FIGS. 13(*a*) to 13(*e*) show a process flow for another embodiment of a method of fabricating the power/ground wrap 108 which is part of the reduced cross-talk interposer of the present invention. The fabrication process shown begins with a dielectric substrate 1400 (e.g., a dielectric film such as polyimide, as shown in FIG. 13(*a*)). Through vias 1402 are formed in the substrate at the desired locations (FIG. 13(*b*)). The vias may be formed by a laser drill, plasma etching, or another suitable method. The vias are then filled with a conductive material, and a conductive layer 1404 is formed on the upper and lower surfaces of the substrate (FIG. 13(*c*)). The upper/outer conductive surface 1430 of the power/ground wrap will be patterned to form the ground layer of the power/ground wrap, with electrically isolated pads for signal and power interconnections between the IC chip, interposer, and substrate. The lower/inner conductive surface 1432 of the power/ground wrap will be patterned to form the power layer of the power/ground wrap, with electrically isolated pads for signal interconnections between the IC chip, interposer, and substrate.

Dielectric layer 1400 is typically 25 to 50 microns thick. Ground layer 1430 provides a continuous ground plane formed from a 5 to 20 micron thick layer of copper, for example. Ground layer 1430 includes isolation rings to permit power and signal lines to be fed through the layer. The signal 1440 and power 1442 pads formed on ground layer 1430 are typically 100 microns wide with a pitch of 250 microns. Note that the size or pitch may be altered if desired since a ground connection via is not needed.

Power layer 1432 provides a continuous plane formed from a 5 to 20 micron thick layer of copper, for example and includes isolation rings to permit signal lines to be fed through the layer. The signal pads 1444 formed on power layer 1432 are typically 100 microns wide with a pitch of 350 microns.

The conductive material used to fill the vias and form the conductive layers may be applied by an electroless and/or electrolytic plating process. Metal chemical vapor deposition (MCVD) or another suitable process may also be used.

After formation, the conductive layers on the upper and lower surfaces of the substrate are patterned to form the desired power, ground, and signal connections 1406 (FIG. 13(*d*)). A subtractive process may be used to form the patterned layers. Since substrate 1400 is a thin-film, it may be bent to form the "U" shaped structure of FIG. 13(*e*) (or another desired shape) from that of FIG. 13(*d*). As noted, the top surface 1430 of power/ground wrap 108 forms the ground layer and includes isolated pads for signal 1440 and power 1442 interconnections. The bottom surface 1432 of power/ground wrap 108 forms the power layer and includes isolated pads for signal interconnections 1444.

With the signal core of FIG. 3 inserted between the upper and lower substrates of the power/ground wrap, signal connections may be made between the base substrate (element 102 of FIG. 1), the signal core, and the integrated circuit chip(s) in isolation from the power and ground connections between the base substrate and the chip(s). This permits an increase in signal line density and minimization of signal path lengths, while achieving a high degree of electrical isolation between the different types of lines. Note that in the design for power/ground wrap 108 shown in the figure, the ground connections are arranged on the outside surfaces of the wrap, while the power connections are on the inside surfaces. This acts to isolate the power and ground connections from each other, as well as from the signal connections which pass through the signal core.

Figure 14:
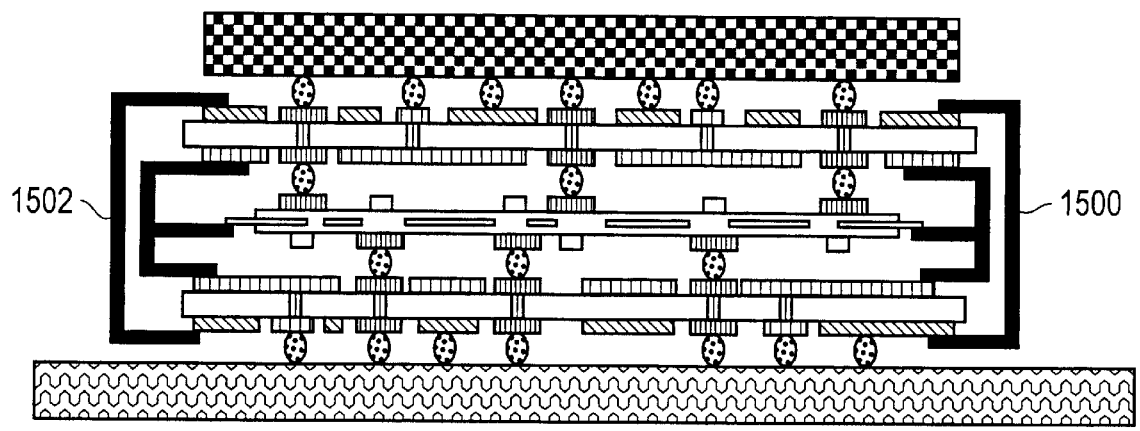
FIG. 14 is a schematic cross-sectional view of another embodiment of the reduced cross-talk signal interposer of the present invention, and is shown positioned between a printed circuit board and an integrated circuit chip.

FIG. 14 is a schematic cross-sectional view of a different construction of the reduced cross-talk signal interposer of the present invention, and is shown positioned between a printed circuit board and an integrated circuit chip. In this situation, the need for precise alignment between the top, bottom, and sides of the wrap and the signal core (which is present in the method described previously with respect to FIG. 13) is lessened. Instead, the top and bottom substrates of the ground/power layers may be fabricated as separate substrates (instead of being formed by bending a single flexible substrate) and assembled to the signal core separately. Edge connectors 1500, 1502 are used to interconnect the power/ground layers between the two power/ground substrates and the power/ground layer of the signal core as needed. Note that for the "wrapped" structure shown in FIG. 1, a single set of edge connectors 1500 (on one end of the substrates) is used to provide the desired interconnections between the power/ground layers and the power/ground layer of the signal core.

When fabricating the reduced cross-talk signal interposer structure, the upper power/ground substrate or surface, signal core, and lower power/ground substrate or surface are interconnected as required using a suitable z-connection technology, followed by attachment of the edge connector or connectors to interconnect the power/ground substrates.

A preferred z-connection technology suited for use in constructing the present invention is described in U.S. patent application Ser. No. 09/192,003, filed Nov. 13$^{th}$, 1998, entitled "Multilayer Laminated Substrates With High Density Interconnects and Methods of Making the Same", assigned to the assignee of the present invention, and the contents of which is incorporated by reference.

The integrated circuit chip(s) can be attached to the interposer 108 by flip chip, TAB (tape automated bonding), flip TAB, wire bonding, or another suitable method. For most applications, the preferred interconnection method is a flip chip area array process. The interposer can be connected to the PCB or other substrate by means of a ball grid array (BGA).

The interposer structure provides several important advantages compared to conventional interposers. Firstly, since there are no power and ground line interconnects passing through the signal core, the signal routing density can be higher than for conventional interposers. This occurs because the separation between vias in which signal lines can be formed in the inventive structure is increased by a factor of approximately the square root of 2 relative to the separation between signal, power, or ground lines on a chip. For example, the separation between signal vias on the interposer becomes approximately 350 microns for applications with a 250 micron via pitch on the chip. This means that the signal line routing density can be increased on the interposer relative to its value for the chip, without introducing significant cross-talk, etc. (i.e., a signal line pitch of 250 microns on the interposer corresponds to a smaller, impractical pitch on the chip if all of the signal, power, and ground lines were fabricated on the chip).

This benefit of the present invention can be understood by reference to the following diagrams. With S: signal, V: power, and G: ground, the lines on the chip can be represented as:

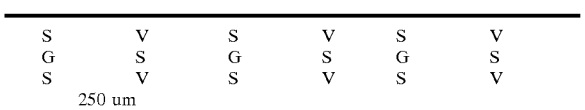

The separation between lines (pitch) is shown as 250 microns, a typical value.

However, with the inventive interposer structure, the signal core lines can be represented as:

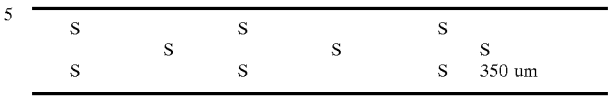

The separation between signal lines is now approximately 350 microns. Thus, assuming a limitation that the lines must be separated by 250 microns, the density of signal lines though the signal core can be increased relative to that of the signal lines on the chip. Since the signal lines pass through the power/ground layers, the lines are shorter than if they were required to pass around the power and ground lines. This reduces signal delays and propagation losses.

Another benefit of the present invention is that because the signal core and power/ground wrap are fabricated in parallel instead of as part of a sequential process flow, the two structures can be fabricated and tested separately. This reduces the cycle time and improves the yield for the overall process. It also permits different technologies and processes to be used for the two structures, permitting optimization of the process flow for each structure (and the associated reduction in processing cost). In addition, since the majority of the power and ground vias typically used can be replaced by edge connectors, the number of vias formed is reduced, reducing the fabrication cost.

Although the present invention has been described with reference to exemplary materials and processes, it may also be practiced using other embodiments and variations of the inventive concept. For example, the signal core as well as the power/ground layers can be fabricated from flexible films or printed circuit boards (for low cost, low performance systems). If a printed circuit board is used for the signal core, then due to the low wiring density, more than one signal core can be laminated to a support substrate, or to another signal core.

If a decoupling capacitor is required, then a thin film capacitor can be connected to the power/ground layers externally by connection to the edge connector in one (x) direction. If a termination resistor is required, then a thin film resistor can be connected to the edge of the signal layers externally in another (y) direction.

The structure of the interposer 108 also exhibits reduced cross-talk between signal lines in the different layers of the signal core because of the presence of the power/ground layer in the signal core. This permits greater flexibility in the signal line routing because of a lessened concern for cross-talk noise (e.g., mixed signal layers (both X and Y) can be routed in each signal core layer). This can be a substantial advantage for high performance applications.

In addition to reducing signal line cross-talk, the power/ground layer of the signal core also supplies increased rigidity to the flexible signal core substrate, increasing its positional stability. This results in reduced uncertainty in the location of the signal vias passing through the signal core, allowing the use of smaller signal pads. This further increase the space in which signal lines can be routed for a given via pitch.

Although the described embodiment of the power/ground wrap has two layers, the total number of power/ground layers can be greater. Each of the layers can be connected through the edge connector(s). Note that a flexible edge insert can be built within the power/ground layers. The flexible edge insert can be inserted into the edge connector for the purpose of accommodating problems arising from the non-planarity of the edge connector.

The signal core can be fabricated using a buildup process if the higher signal line density justifies the increased fabrication cost. The signal core and/or power/ground layers can be formed from flexible films or printed circuit boards (PCB, for lower cost and lower performance systems). If a PCB is used for the signal core, then multiple such cores may be laminated together. Thin film capacitors (TFC) may be used as decoupling capacitors. Thin film resistors (TFR) may be used as termination resistors. Additional signal layers can be formed into the structure, with the additional layers being electrically separated from each other (and the other layers) by a power/ground plane.

Figure 15:
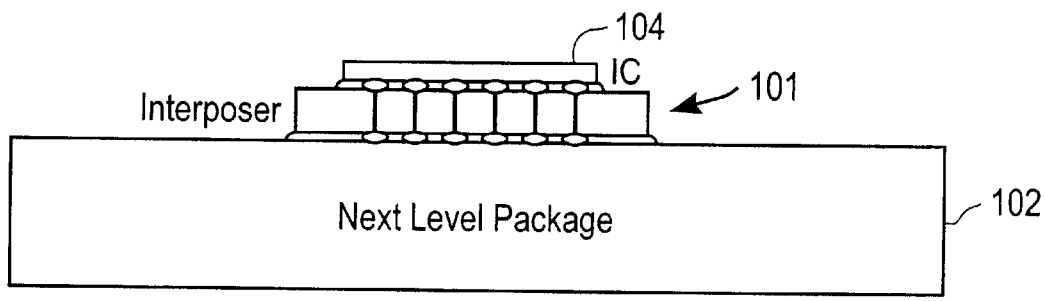
FIG. 15 is a schematic cross-sectional view of another embodiment of the composite interposer of the present inventions positioned between a printed circuit board and an integrated circuit chip.
Figure 16:
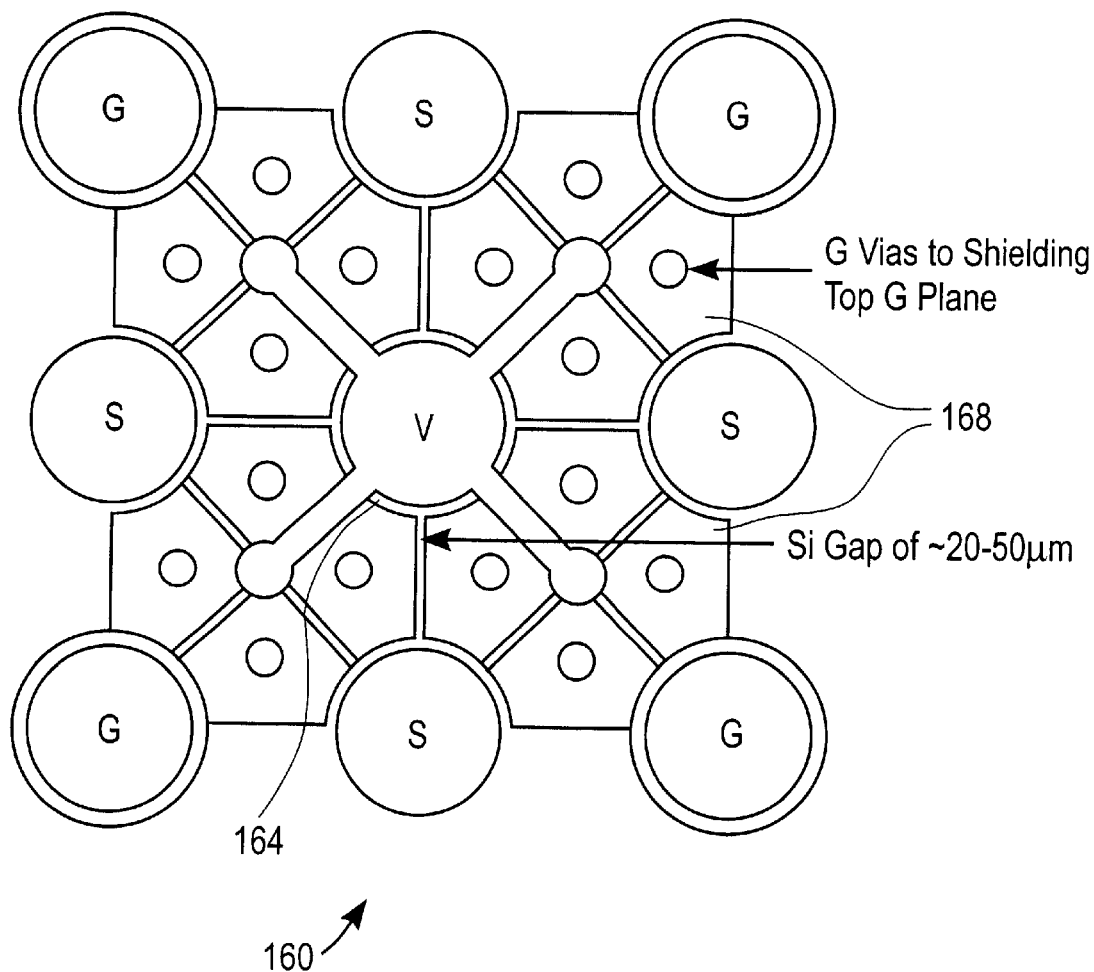
FIG. 16 is a top plan view of the composite interposer of FIG. 15.
Figure 17:
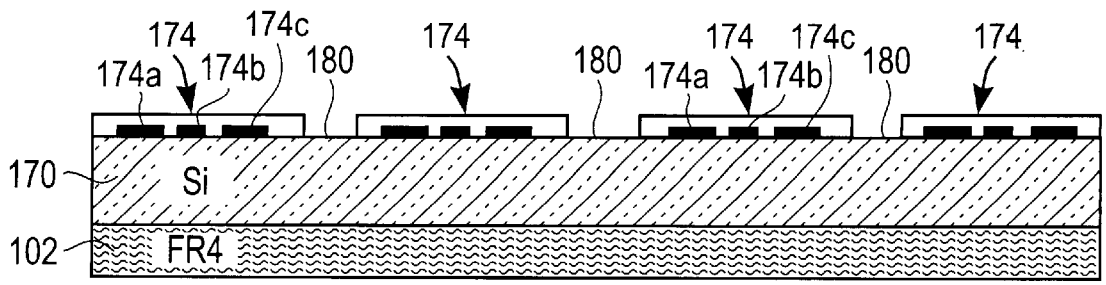
FIGS. 17–23 illustrate a process flow of a method for fabricating one embodiment of the composite interposer.

Referring now to FIGS. 15–44 for additional embodiments of the present invention, there is respectively seen in FIGS. 15 and 16 a composite interposer 101 disposed between printed circuit board (PCB) 102 and integrated circuit chip 104, and a top plan view of one embodiment of the composite interposer 101. FIG. 16 discloses a four (4) micro-singulated silicon die 160 surrounding a voltage pad area, generally illustrated as 164. Each micro-singulated silicon die 160 is segmented into four (4) discrete capacitor areas, which are typically necessary to provide high capacitance values with >Ghz resonance frequencies. Each of the segmented discrete capacitor areas on the singulated die 160 may be multilayer parallel capacitors. A top layer 168 (see FIG. 16) of common ground shielding is provided. The G vias, S vias, and V vias are all through vias (e.g., FIG. 16 illustrates nine (9) through vias) extending from integrated circuit chip 104 to PCB 102 and are formed by openings (identified as "184" below) and vias (identified as "186" below). The connections to the voltage pad area 164 are shown for schematic purposes only.

Figure 18:
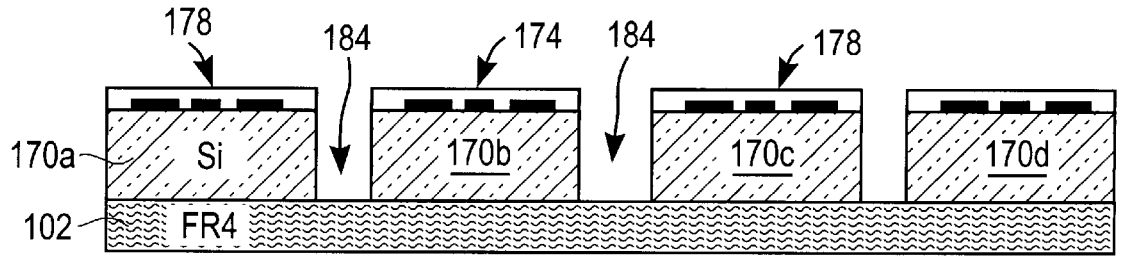
Figure 19:
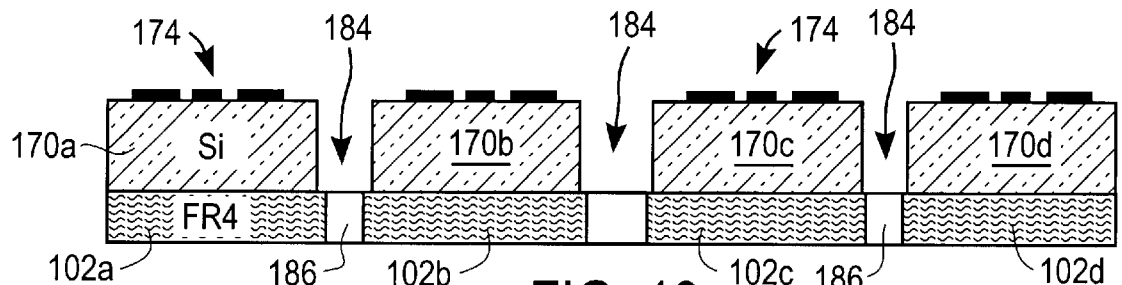

In FIGS. 17–23 there is illustrated a process flow of a method for fabricating one embodiment of the composite interposer 101. In the process step illustrated in FIG. 17, a silicon layer 170 (e.g. a previously processed and tested silicon wafer) having a thickness ranging from about 100 $\mu$m to about 300 $\mu$m, such as about 200 $\mu$m, is adhesively attached to the circuit board 102 (i.e., an organic board). A plurality of groups or clustered semiconductor devices is disposed on the silicon layer 170. Each semiconductor group is exemplified by the number 174 and includes semiconductor devices 174a, 174b and 174c, such as capacitors. Semiconductor devices 174a, 174b and 174c are preferably capacitors having at least one G via and V via. A dielectric layer is disposed on silicon layer 170 and patterned such that each group of semiconductor devices 174 is encapsulated by a dielectric capsule 178 and separated by openings 180. The dielectric layer for forming dielectric capsules 178 may be composed of any suitable dielectric material, preferably an organic dielectric such as photoresist, photo-definable polyimide, or photo-definable epoxy. Subsequently, the silicon layer 170 is etched through the openings 184 down to the circuit board, 102 as best shown in FIG. 18, to produce a plurality of segmented silicon layers 170a, 170b, 170c and 170d (see FIG. 18). Then vias 186 may be created in the circuit board 102 to produce continuous interconnected circuit boards 102a, 102b, 102c and 102d, supporting segmented silicon layers 170a, 170b, 170c and 170d (see FIG. 19). Optionally, the dielectric capsules 178 may then be removed, such as by stripping, etching, or the like, as seen in FIG. 19, to expose the semiconductor groups 174 along with portions of the segmented silicon layers 170a, 170b, 170c and 170d. Openings 184 and vias 186 are preferably produced with a laser (i.e., cutting with a laser).

Figure 20:
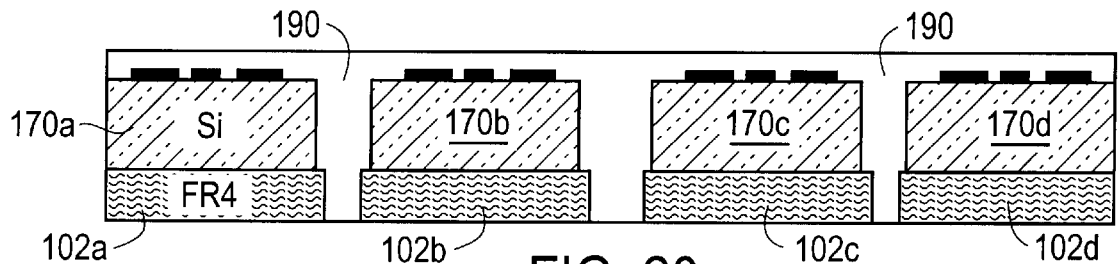
Figure 21:
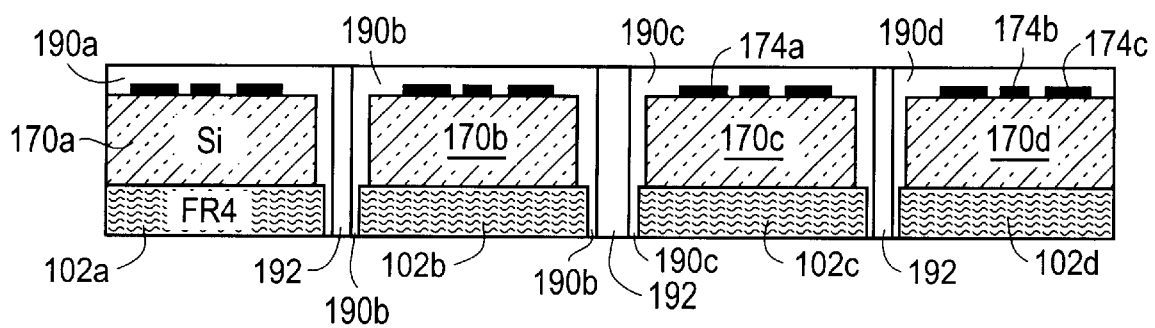

Openings 184 and vias 186 are subsequently filled, and the exposed semiconductor groups 174 and exposed segmented silicon layers 170a, 170b, 170c and 170d, are covered with a dielectric layer 190, as best shown in FIG. 20. The dielectric material for the dielectric layer 190 is preferably an organic dielectric, such as Ajionomoto ABF Series Bonding Sheets and Mitsubishi BT Film. Vias 192 may then be formed in the dielectric layer 190 to produce continuous interconnected dielectric layers 190a, 190b, 190c and 190d, respectively containing segmented silicon layer 170a, segmented silicon layer 170b, segmented silicon layer 170c, and segmented silicon layer 170d, along with the respective associated semiconductors groups 174. Capacitor defect isolations may be performed on the produced assemblies of FIG. 21 by laser-opening vias over good capacitors which were discovered before the deposition of dielectric layer 190. More specifically, the capacitors (e.g., capacitors 174a, 174b, 174c) are tested for defects. Typically, this testing would be done prior to attaching the Si substrate (e.g., silicon layer 170) to the circuit board (e.g., PCB 102). The testing of the capacitors could also be done prior to the deposition of the dielectric layer 190. As an example of a testing procedure, the capacitors can be screened for defects by applying a bias voltage and measuring the leakage current. Any capacitors with high leakage currents would then be identified as defects. This information may then be used when laser drilling so that voltage vias are drilled only to the good capacitors. The laser which is used to form openings over good capacitors is computer operated. The information on defective capacitors is stored in the memory banks of the computer which controls the operation of the laser. When the laser is over a defective capacitor, the computer prevents the laser from being activated and subsequently moves the laser over a good capacitor. Thus, the computer moves the laser only over non-defective, good capacitors for laser-drilling purposes.

Figure 22:
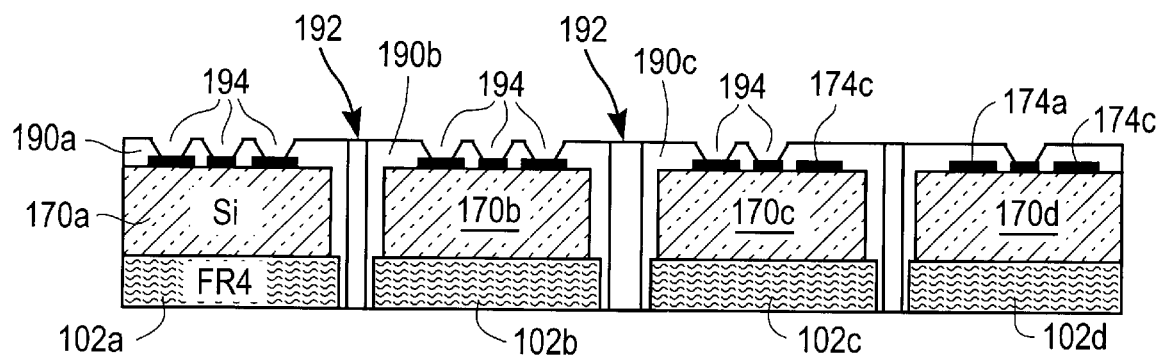
Figure 23:
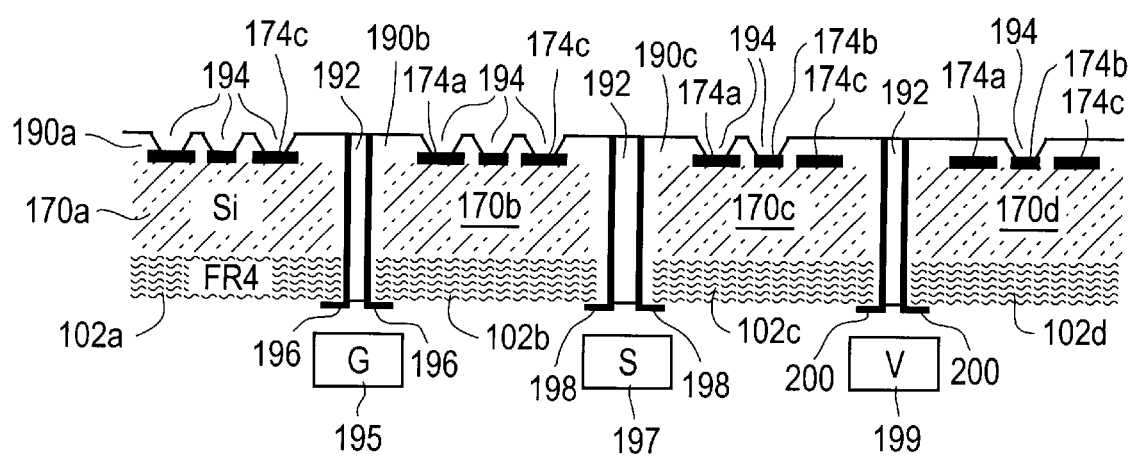
Figure 24:
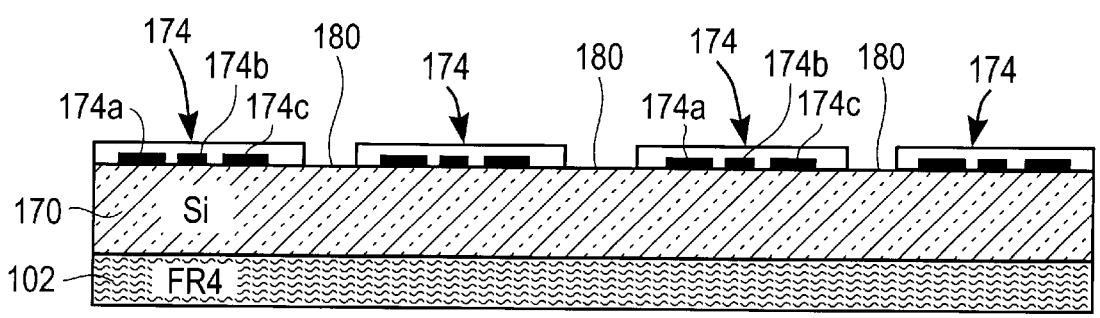
FIGS. 24–30 illustrate a process flow of a method for fabricating another embodiment of the composite interposer.
Figure 25:
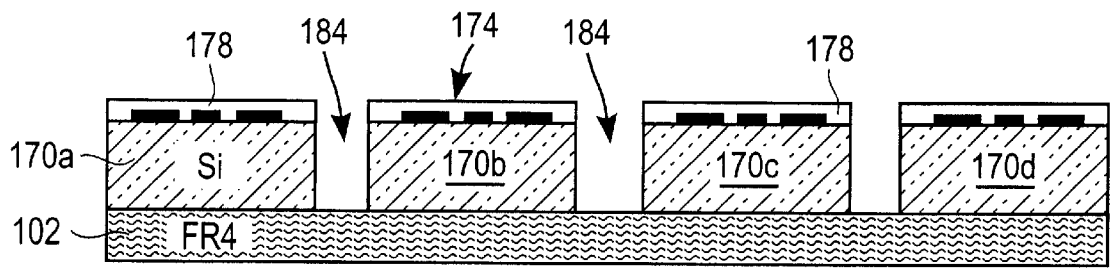

Openings 194 are formed, such as with a laser, to expose known good capacitor pads and not defective capacitor pads. As shown in FIG. 22, capacitor 174c, which is supported by segmented silicon layer 170c, and capacitors 174a and 174c, which are supported by segmented silicon layer 170d, are covered with dielectric layer 190 and are not exposed from any opening 194. Subsequently, selective capacitors are electrically coupled to appropriate pads, such as ground pads or voltage pads, by e-less and electrolytic metal plating, such as with copper. More specifically, and as best shown in FIG. 23, the ground pad for capacitor 174c, supported by segmented silicon layer 170a, and the ground pad for capacitor 174a, supported by segmented silicon layer 170b, are coupled in parallel to a ground pad 195 through opposed metal (e.g., copper metal) linings 196—196 by the combination of e-less and electrolytic plating, well known to those skilled in the art. Similarly, the voltage pad for capacitor 174b, supported by segmented silicon layer 170c, and the voltage pad for capacitor 174b, supported by segmented silicon layer 170d, are coupled in parallel to voltage pad 199 through opposed metal (e.g., copper) linings 200—200. The vias 192 between opposed metal linings 196—196, 198—198, and 200—200 may be filled with a suitable dielectric material, followed by conventional capping, solder masks pad defining, ball attaching and assembly processing (not shown in the drawings).

Figure 26:
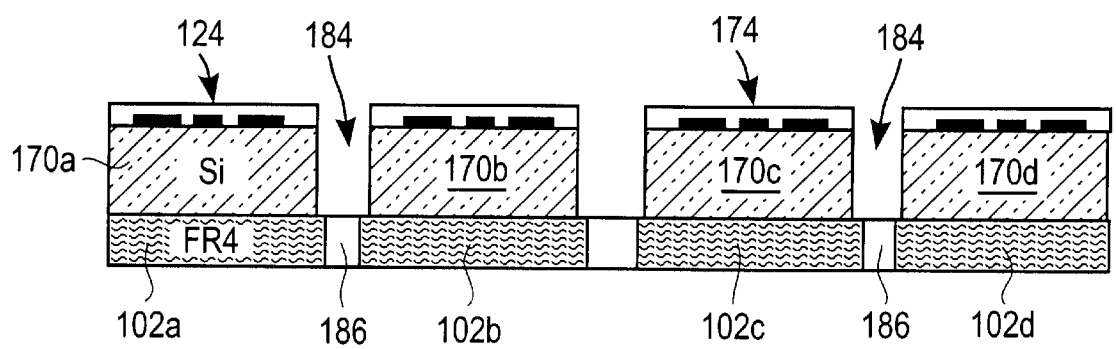
Figure 27:
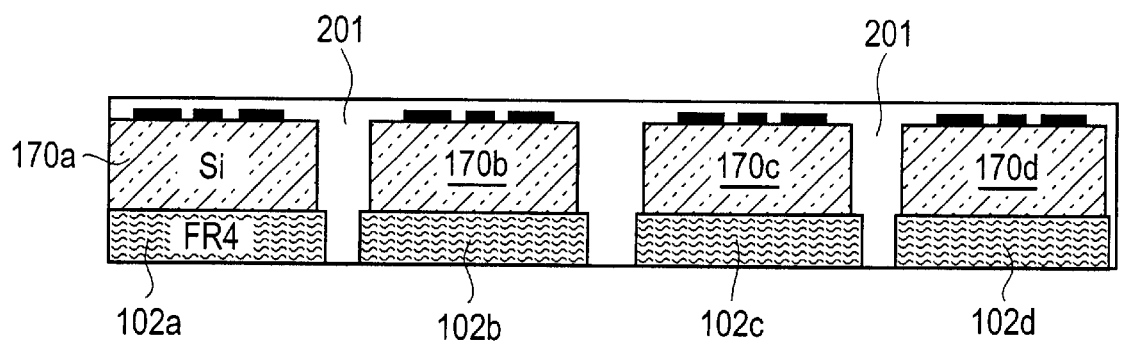
Figure 28:
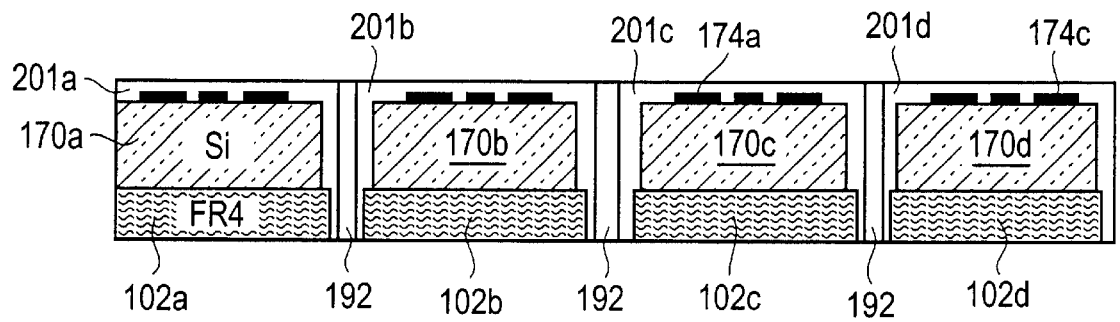
Figure 29:
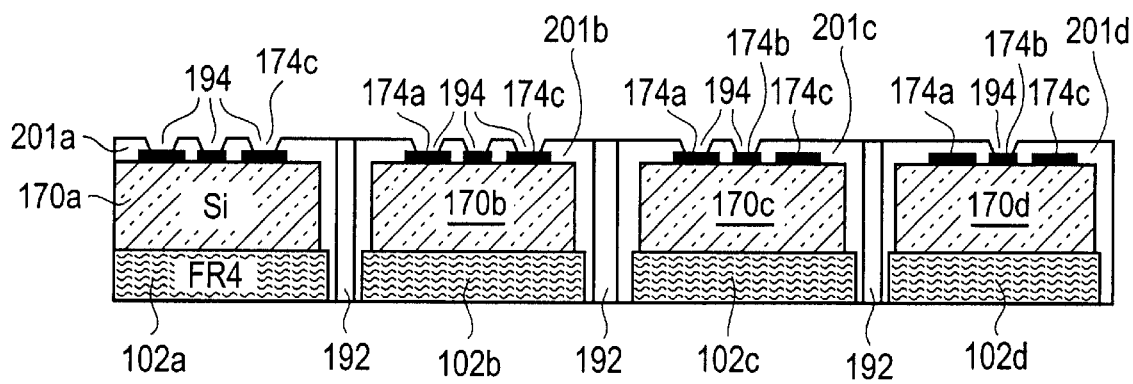
Figure 30:
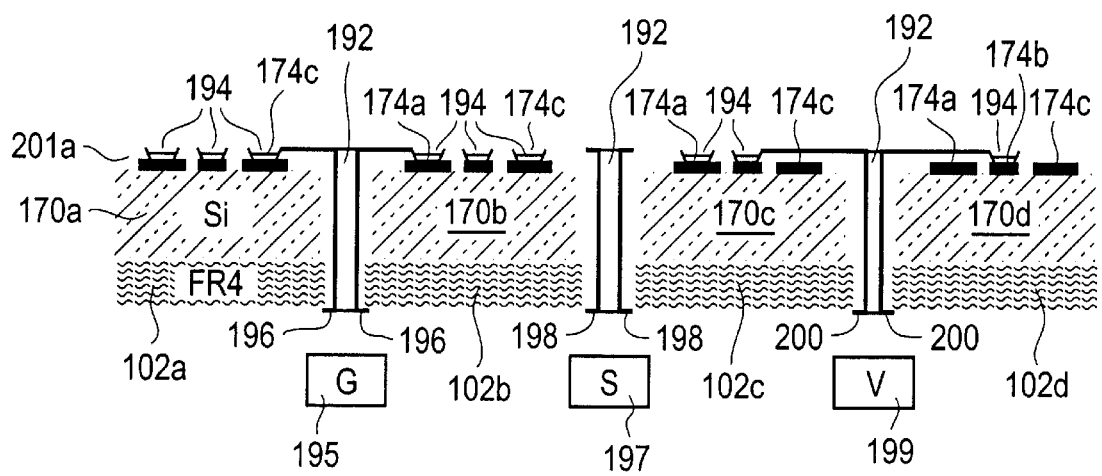

Referring now to FIGS. 24–30 for another embodiment of the present invention, instead of dielectric layer 190 being employed to fill openings 184 and 196 and to exposed semiconductor groups 174 and exposed portions of the segmented silicon layers 170a, 170b, 170c and 170d of FIG. 19, a high-aspect-ratio capable material 201 (see FIG. 27) is employed to fill openings 184 and 196, and to cover the exposed semiconductor groups 174 and exposed portions of the segmented silicon layers 170a, 170b, 170c, and 170d of FIG. 26. High-aspect-ratio capable material is material which is capable of passing into a high aspect ratio aperture to form high aspect ratio vias. The aspect ratio of an aperture or a corresponding via structure may be defined as the high H of the aperture divided by the smallest cross-sectional width D of the aperture. For example, an aperture with a height H and a width D has as aspect ratio of H/D. The apertures or the formed via structures may have aspect ratios of about 20:1 or more with heights of, e.g., about 450 microns or more, and preferably aspect ratios of about 30:1 or more with heights of, e.g., about 600 microns or more. Material 201 has an aspect ratio ranging from about 2:1 to about 40:1, preferably from about 4:1 to about 15:1, more preferably from about 6:1 to about 8:1. Material 201 is preferably an epoxy polymer which may be purchased commercially under the trade name SU-8 which was originally developed and patented by IBM-Watson Research Center (Yorktown Height, USA). Current manufacturers of SU-8 are MicroChem Corp. (previously named Microlithography Chemical Corp.), Sotec Microsystems (spin-off from EPFL) in Switzerland, and Mimotec (also spin-off from EPFL). After vias 192 (which are preferably photo-definable through vias, not produced by laser drilling) are formed, layers 201a, 201b, 201c, and 201d remain from the material 201. As best shown in FIG. 28, lasers 201a, 201b, 201c, and 201d surround segmented silicon layer 170a, segmented silicon layer 170b, segmented silicon layer 170c, and segmented silicon layer 170d, respectively.

Figure 31:
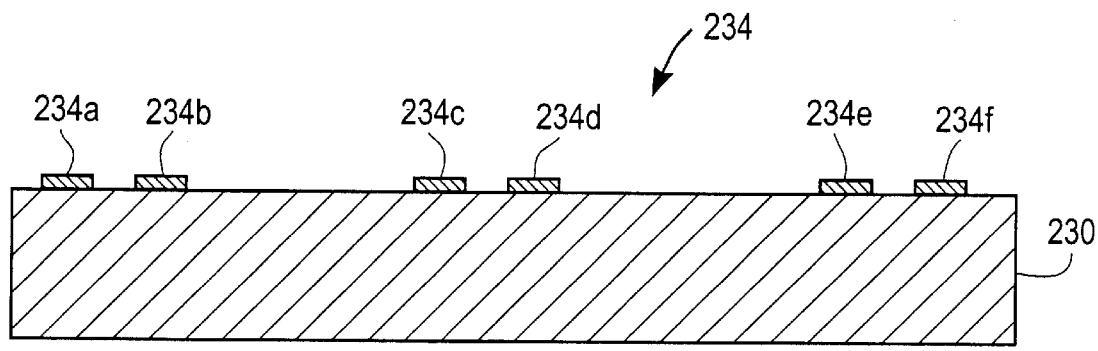
Figure 32:
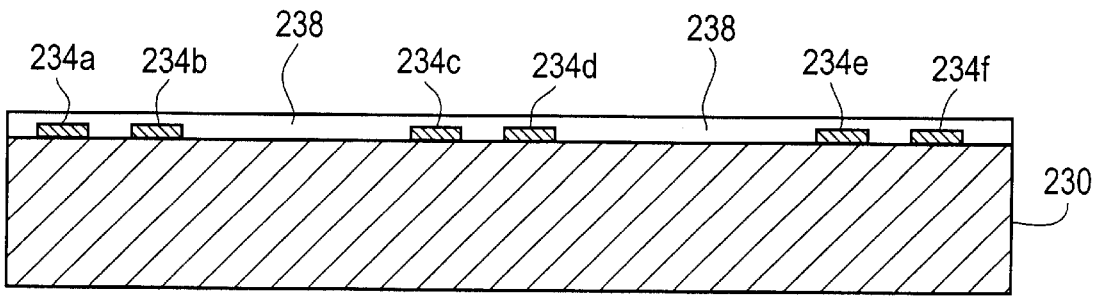

Referring now to FIGS. 31–37 for another embodiment of the invention, illustrating backside etch with an integrated voltage plane and an integrated ground plane, there is seen in FIG. 31 a silicon layer (i.e., a pretested silicon wafer) 230 supporting a plurality of conductive elements, illustrated hereinafter as devices or pads 234, such as devices or pads 234a, 234b, 234c, 234d, 234e, and 234f. The devices or pads 234 may be any suitable device or pad, such as a metallic (Cu) pad. The silicon layer 230 may have any suitable thickness. The silicon layer 230 is tested with all devices or pads 234 disposed as indicated, to determine which devices or pads 234 are defective and which are not. As previously mentioned, the combined silicon layer 230/devices or pads 234 may be tested by as previously indicated. Subsequently, a suitable dielectric layer 238 (e.g. a polyimide) is disposed by CVD, or the like, over all devices or pads 234 including exposed surfaces of the silicon layer 230. Dielectric layer 238 may have any suitable thickness, preferably a thickness ranging from about 1 μm to about 15 μm, more preferably ranging from about 3 μm to about 10 μm. Openings 240 are formed over non-defective devices or pads 234 by laser drilling or opening the dielectric layer 238. If during testing of the silicon layer 230 supporting the devices or pads 234, it was discovered that devices or pads 234e and 234f are defective and that devices or pads 234a, 234b, 234c, and 234d are operable, openings 240 are formed over the operable devices or pads 234 (e.g., devices or pads 234a, 234b, 234c and 234d) are not over non-operable devices or pads 234 (e.g., devices or pads 234e and 234f), as best shown in FIG. 33A.

Figure 33A:
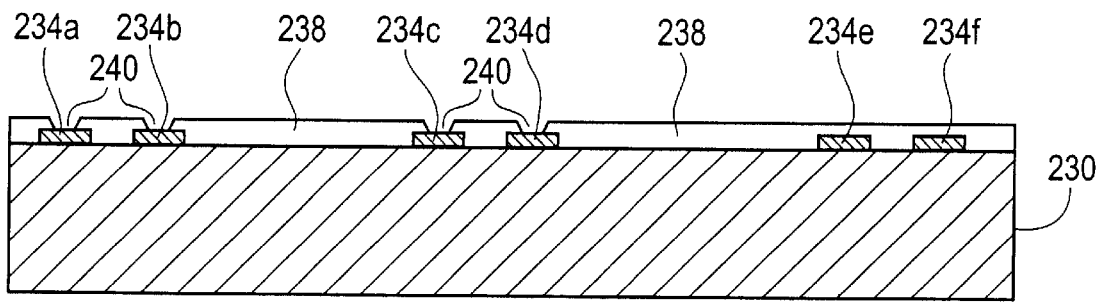
Figure 33B:
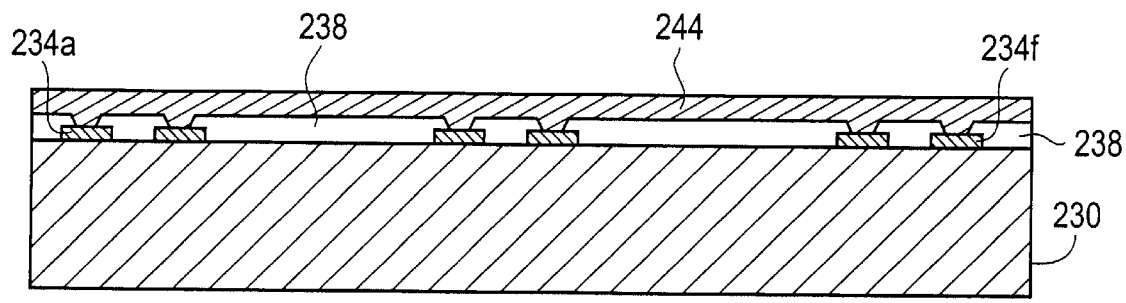
Figure 33C:
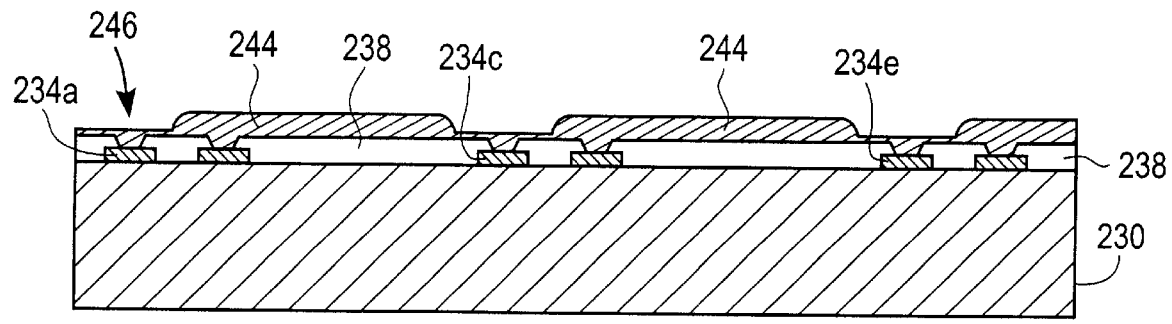
Figure 33D:
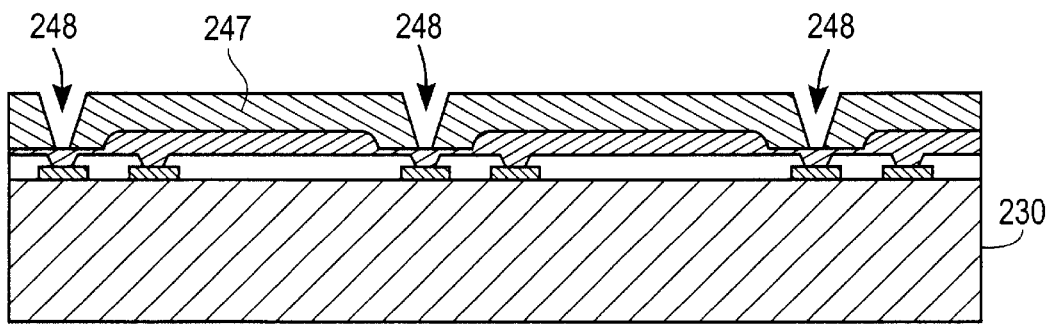
Figure 33E:
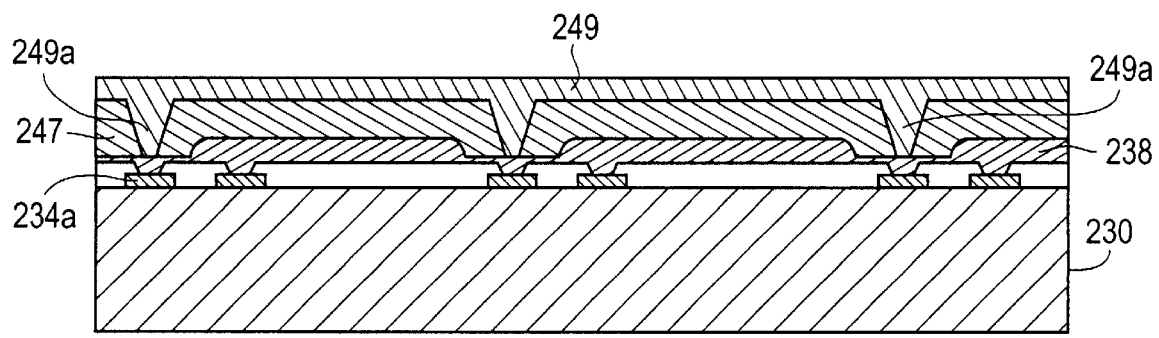

Assuming that all devices or pads 234 are operable, openings 240 are formed over all devices or pads 234, followed by depositing metal (e.g., copper) in the openings 240 and on dielectric layer 238 for filling openings 240 with a metal that is in contact with devices or pads 234a, 234b, 234d, 234e and 234f and for forming a metal (e.g. copper) layer 244 which functions as a ground or voltage plane (see FIG. 33B). Subsequently, metal layer 244 is patterned and etched to electrically isolate devices or pads 234a, 234c and 234d that are not to be shorted to the ground or voltage plane formed by metal layer 244. It is to be noted that the deposition of the metal that plates or fills the vias may be simultaneously with the deposition of the metal that forms metal layer 244. Thus, the metal that plates or fills the vias may be the same metal that forms metal layer 244. A dielectric layer 247 is disposed over the remaining, residual metal layer 244 and over the devices or pads 234a, 234c and 234d, of FIG. 33C. Openings (i.e., vias) 248 are then formed in the dielectric layer 247, as shown in FIG. 33D, to expose metal-supporting devices or pads 234a, 234c and 234d. Metal (e.g. copper) is then deposited in the openings or vias 248 and over the dielectric layer 247 to produce a metal layer 249 having depending metal fills 249a in contact with metal-supporting devices or pads 234a, 234c and 234d, as shown in FIG. 33E. Metal layer 249 functions as a ground or voltage plane.

Metal layer 249, as shown in FIG. 34, may be etched to produce an opening 254. Subsequently, silicon layer 230 (or silicon wafer 230) may be thinned, such as by polishing (i.e., by CMP or the like), grinding, or etching. The silicon layer 230 is preferably thinned-down to a thickness ranging from about 150 μm to about 225 μm, or even less such as from about 40 μm to 100 μm through the use of atmospheric downstream plasma etching, well known to those skilled in the art. The thinned silicon layer 230 may then be patterned with a photoresist or mask and etched (e.g., anisotropic DRIE, laser drilling, wet etching, etc.) to selectively remove portions of the silicon layer 230, producing openings 256 between residual silicon layers 230a, 230b, and 230c that terminate in dielectric layer 238, as best shown in FIG. 35. Openings 256 may then be filled, and the bottoms of residual silicon layers 230a, 230b, and 230c covered, all with a dielectric material (e.g., a polymer, such as a polyimide) 260, followed by securing circuit board 102 to dielectric material 260 through the use of an adhesive or the like. Plated vias 264—264 may then be formed respectively between residual silicon layers 230a, 230b, and between residual silicon layers 230b, 230c, and through dielectric layers 238, 247 and the metal layers, as shown in FIG. 37. Optionally, plated vias 264—264 may be filled with a dielectric material 268 and capped with caps 270—270. Plated vias 264—264 may be formed by any suitable conventional process, such as by laser drilling the necessary vias, and plating (e.g. with copper) by the combination of e-less and electrolytic plating. Dielectric material 268 may be any suitable dielectric material (e.g., polyimides) and caps 270—270 are preferably copper caps.

Figure 38:
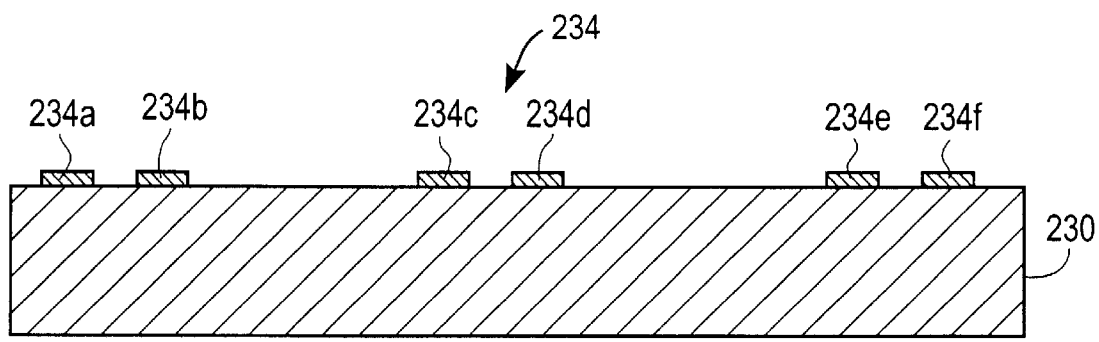
FIGS. 38–44 illustrate a process flow of a method for fabricating a further embodiment of the composite interposer.
Figure 39:
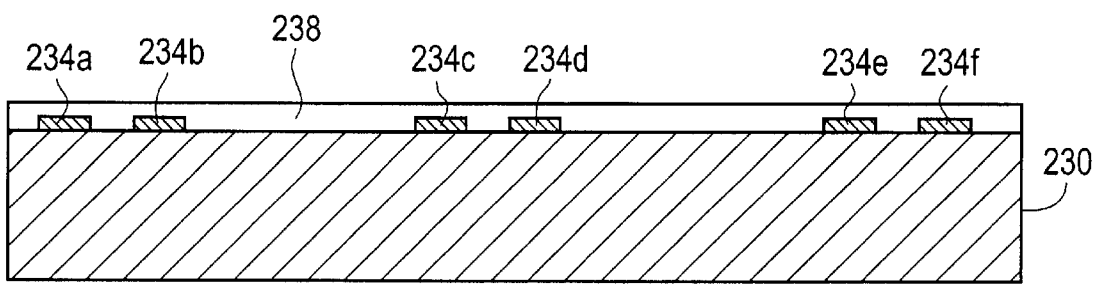
Figure 40:
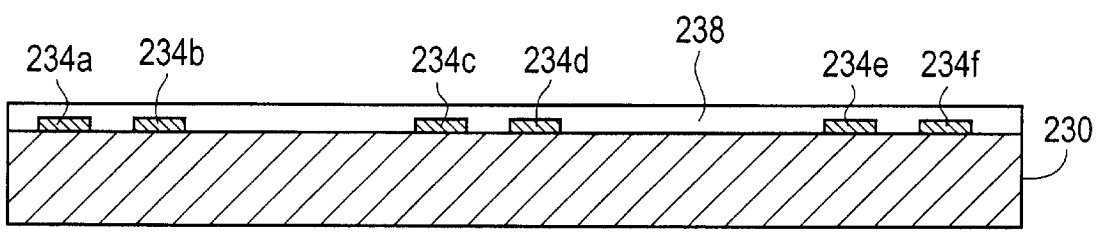
Figure 41:
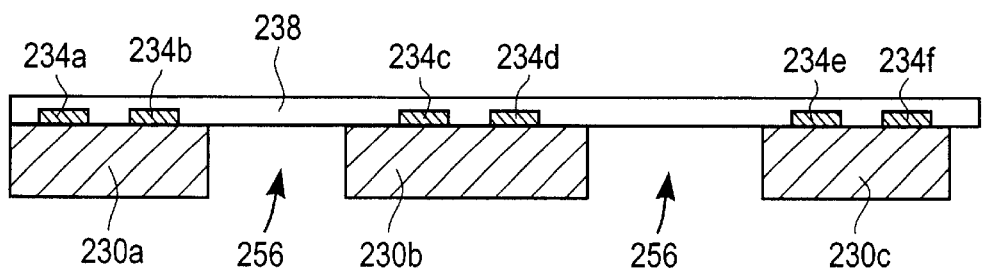
Figure 42:
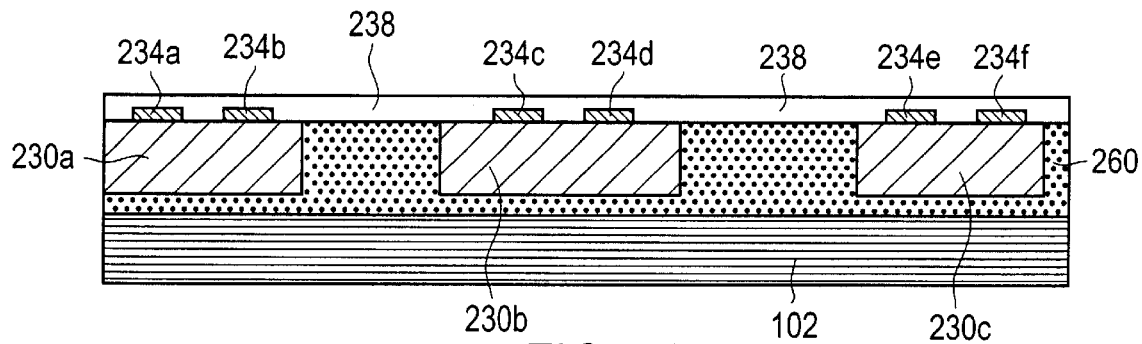
Figure 43:
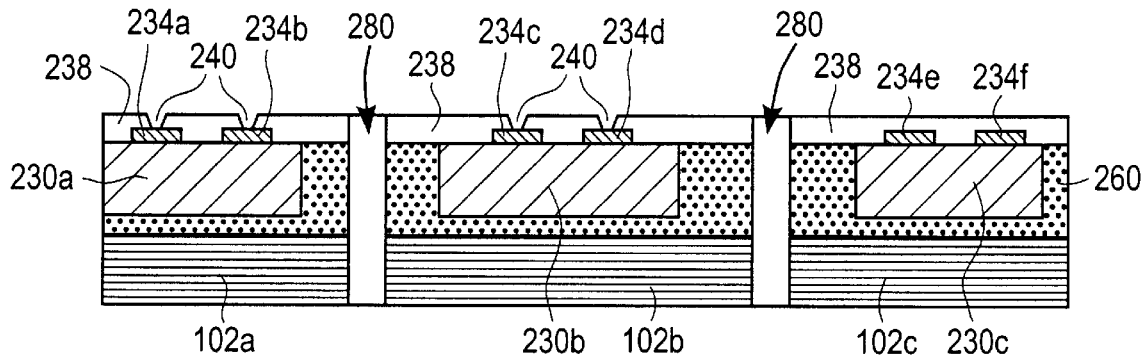
Figure 44:
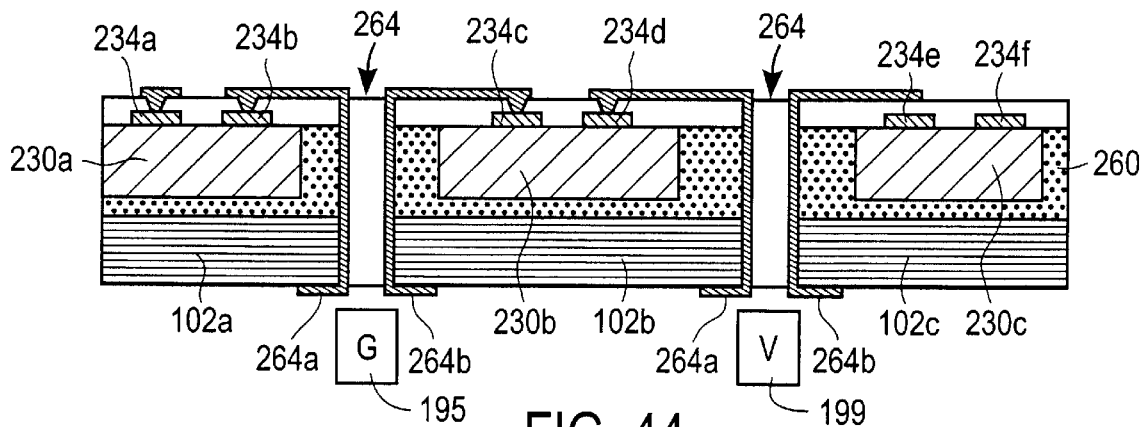

Referring now to FIGS. 38–44 for yet another embodiment of the invention, illustrating backside etch without any integrated power or voltage plane (e.g., metal layer 244) or ground plane (e.g. metal layer 249). FIGS. 38 and 39 represent the same interposer structures and methods of FIGS. 31 and 32. FIG. 40 illustrates the silicon layer 230 after thinning (e.g., by CMP), as reflected in FIG. 34. The silicon layer 230 is then segmented into residual silicon layers 230a, 230b and 230c separated by openings 256, as previously indicated for producing the residual silicon layers 230a, 230b and 230c in FIG. 35, which are also separated or spaced by openings 256. The dielectric material 260 fills the openings 256 and covers the bottoms of residual silicon layers 230a, 230b, and 230c, as reflected in FIG. 42. Circuit board 102 is adhesively connected to the dielectric material 260b, as also reflected in FIG. 36, and openings 280—280 are subsequently produced between residual silicon layers 230*a*, 230*b* and residual silicon layers 230*b*, 230*c* and through dielectric layer 238, dielectric material 260 and circuit board 102, as shown in FIG. 43. Openings 240 are also produced through the dielectric layer 238 to expose operable, non-defective devices or pads 234*a*, 234*b*, 234*c* and 234*d*. It is assumed that devices or pads 234*e* and 234*f* when previously tested, such as previously described with respect to the test performed on the structure of FIG. 39, were discovered to be defective; thus, no openings 240 are to be formed in the dielectric layer 238 to expose devices or pads 234*e* and 234*f*. Openings 240 over devices or pads 234*a*, 234*b*, 234*c* and 234*d* and openings 280—280 are then filled and plated with a metal, such as copper, in accordance with any suitable conventional plating process, such as e-less and electrolytic plating, to produce plated vias 264—264, as shown in FIG. 44. As further best shown in FIG. 44, vias 264—264 each include opposed metal platings 264*a*–264*b* which are coupled to ground pad 195 and voltage/power pad 199. More specifically, ground pad 195 is coupled to devices (i.e., capacitors) or pads 234*b* and 234*c* by metal platings 264*a* and 264*b*, respectively, and device or pad 234*d* is coupled to voltage/power pad 199 by metal plating 264*a*, all as also further best shown in FIG. 44.

Thus, by the practice of the embodiment of this invention illustrated in FIGS. 15–44, a structure and fabrication method are provided for a composite interposer, such as composite interposer 101. A thin silicon layer 170 is embedded in an organic dielectric, such as dielectric layer 190. One of the salient features of an embodiment of the present invention is that silicon layer 170 is segmented, thereby lowering the risk of fracture of the thinned silicon substrate. Metallized-through vias (e.g., vias 192 and 264) are fabricated through the organic dielectric to provide for electrical connection between the integrated circuit 104 above the composite interposer 101 and the PCB 102 below the composite interposer 101. This also lowers the risk of the thinned silicon substrate fracturing in that there are no vias and their associated stress concentrators through the silicon substrate 170. Embedded active and passive semiconductor devices can be fabricated on embedded substrates. The positioning of passive semiconductor devices, such as the capacitors, on the composite interposer 101 minimizes the inductances associated with them, optimizing their high frequency performance. Furthermore, defective capacitors may be isolated in this structure, as was previously indicated.

The integrated capacitors of the composite interposer 101 are positioned on the silicon substrate 170 such that they can supply charge to the IC chip 104 at greater than GHz frequencies for high frequency, bypass decoupling applications. Stated alternatively, the positioning of the capacitors on the composite interposer 101 directly beneath the IC 104 lowers the associated inductances, allowing the capacitors to effectively decouple the IC 104 at greater than GHz frequencies. Other passive and active components can also be placed on the silicon substrate 170 embedded in the composite interposer 101.

The composite interposer 101 includes a singulated, thin silicon die embedded in an organic dielectric as shown in FIG. 16. The composite interposer structure makes it possible to embed capacitors proximate to the IC 104, minimizing the inductances and allowing the charge to be drawn by the IC 104 at greater than GHz frequencies. The metallized through vias allow the interposer 101 to be placed directly beneath the IC 104 without restricting the routing of signals, power vias, or the thermal vias directly beneath the IC 104. The singulation of the silicon and the avoidance of any through vias in the silicon reduce the risk of cracking compared to that of a large area, thinned silicon with through vias.

The silicon substrate 107 allows the use of high-k dielectrics and their associated high processing temperatures in the capacitors. Other components that require silicon substrates may also be incorporated. The epoxy polymer in which the silicon is embedded, and through which the through holes are formed, is compatible with e-less metal (copper) plating. The use of thin, high-k dielectric layers (e.g., layer 178) yields not only higher capacitance densities, but also less signal propagation delay than conventional thicker, ceramic-embedded polymer dielectric layers. The fabrication processes allow the pre-testing and isolation of defective capacitors, an important consideration when considering large total capacitances. Each voltage via is attached to multiple capacitors as shown in FIG. 16. Therefore, if one of these capacitors is shorted, the shorted or defective capacitor may be isolated, and the necessary capacitance may be obtained from the neighboring capacitors. Because the composite interposer 101 will be interconnected to the PCB 102 which will have V/G planes, multiple capacitors will be connected in parallel to each voltage regulator module. Each of these capacitors may have a different inductance relative to that module, which will result in a low power supply impedance over a large range of frequencies. Several small, different valued, parallel capacitors on separate pieces of silicon may be connected to each V and G via. This structure with singulated silicon embedded in an organic dielectric may be used to embed active components on the silicon. The composite interposers 101 may be stacked back-to-back to allow larger capacitance values.

Figure 45:
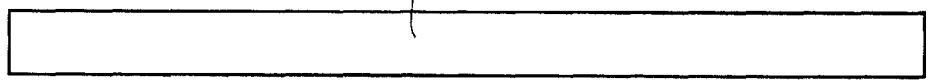
FIGS. 45–48 illustrate a process flow of a method for establishing Z-connection between substrates by solder joints formed through lamination.
Figure 46:
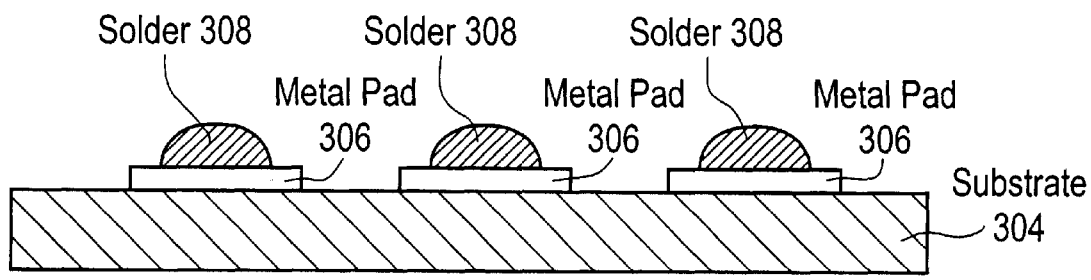

Referring now to FIGS. 45–48, there is seen an exemplary illustration of a process for establishing Z-connection between substrates by solder joints formed through lamination. The laminated substrates form part of a multilayer module for use in a wide variety of electronic and computer applications. The first step in establishing Z-connection between two substrates is to tack laminate a polymer bonding sheet 302 onto a bumped substrate 304, as depicted in FIG. 45 and FIG. 46. Bumped substrate 304 includes metal pads 306, with metal pad 302 supported by a solder bump 308. During this tack lamination step, the bonding sheet is pressed, under vacuum and heat, against the bumped side of the substrate 304. Vacuum is essential for avoiding entrap voids at bonding sheet 302 to substrate interfaces. Temperature during tack lamination is carefully controlled to prevent premature hardening of the bonding sheet 302 which will degrade its associated adhesion to the substrate.

Figure 47:
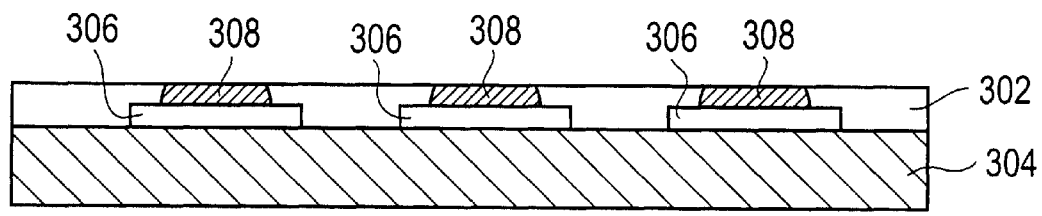

Two important functions are performed during the tack lamination step. The first function is to bond the bonding sheet 302 to the bumped substrate 304 so that there is good contact at all interfaces between bonding sheet 302 and substrate components. The second function is to flatten the top portion of the solder bump 308. This flattening action increases the surface area of exposed solder in preparation for Z-connection, and also breaks the solder surface to allow fresh solder to flow out during lamination and thus form the joint with the matching substrate. FIG. 47 depicts the result after tack lamination.

Figure 48:
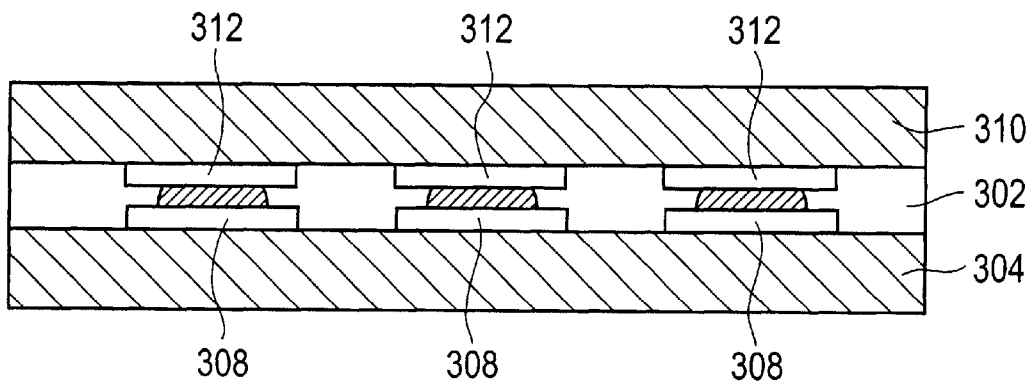

After visual alignment of tack laminated substrate to a matching substrate 310 having metal pads 312, the aligned substrates are laminated to establish the Z-connection between them (as depicted in FIG. 48). Again, vacuum is used to prevent voids from forming at bonding sheet 302 to substrate components interfaces. Lamination is performed under pressure (applied on substrates) and controlled temperature ramping. During temperature ramping the substrates 304 and 310 are heated to allow solder of solder bumps 308 to melt and to form the Z-connection between metal pads 308 and 312 on the matching substrates 304 and 310. After lamination the bonding sheet 302 becomes an integral part of the laminated structure, as best shown in FIG. 48.

In comparison to conventional buildup processes, the invention provides a simpler and more efficient approach to multilayer module fabrication. During the lamination step, both dielectric (or underfill) layer and Z-connection between substrates 304 and 310 are established. Further need for underfill between substrates 304 and 310 is eliminated. In addition, both tack lamination and lamination steps do not require use of resists or via drilling. Hence, overall process is simplified and fabrication cost is reduced. Normally, flux is needed to clean solder surfaces in preparation for Z-connection. Use of flux complicates the process by requiring further cleaning, steps, which may be very difficult for large area substrates. By flattening the solder top during tack lamination, fresh solder is exposed which makes the joint to matching substrate possible without using a flux. Flux residues, if left on the substrates, may degrade long term performance of fabricated multilayer module. The solder of solder bumps 308 may be 95Sn/5Sb and bonding sheet 302 may be an epoxy-phenolic film with 50% silica filler (average of 1 $\mu$m particle size).

During the tack lamination procedure in which the polymer bonding sheet 302 is bonded onto the bumped substrate 304, the bonding sheet 302 is deformed to fill in and adhere to all interfaces between the bonding sheet 302 and substrate components. The resulting surface of top layer of bonding sheet 302 after tack lamination is relatively flat, with flattened solder surfaces exposed, making it easy to place and align the matching substrate 310. In the tack lamination procedure, solder bumps 308 are flattened at the top to increase exposed surface area of solder and to break open exposed solder surface so fresh solder can flow out during reflow and form the Z-connection, eliminating the necessity to use a flux to form the Z-connection. The use of solder (from plating or from paste printing and reflow) and the bonding sheet 302 in a two step tack lamination and lamination procedure for establishing Z-connection between substrates 304 and 310 eliminates the necessity for underfill after Z-connection is established. The use of vacuum and details of pressure and temperature ramping achieve the desired lamination results.

Figure 49:
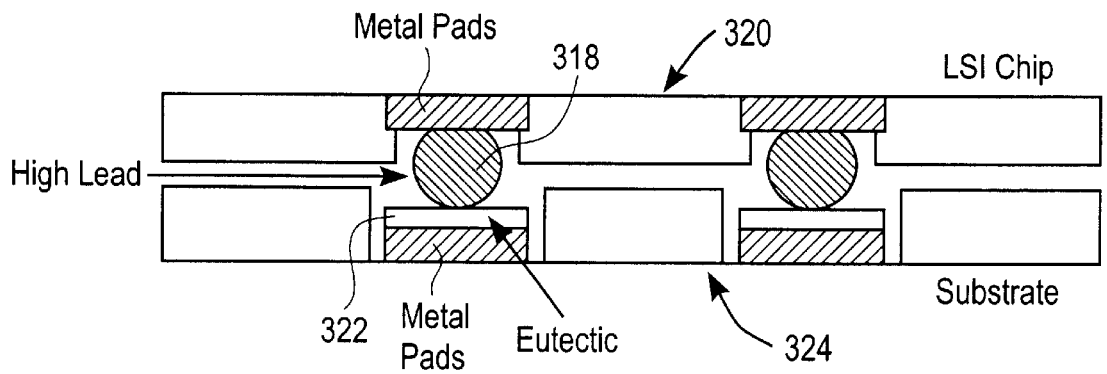
FIGS. 49–51 illustrate a process of solder bumping using a composite solder (i.e., a high lead solder core having an eutectic solder overcoat) to improve coupling of two conductor pads through soldering.
Figure 50:
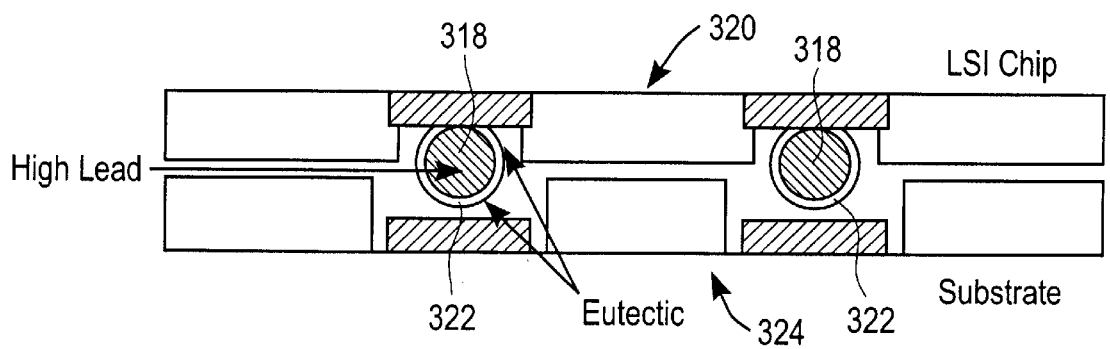
Figure 51:
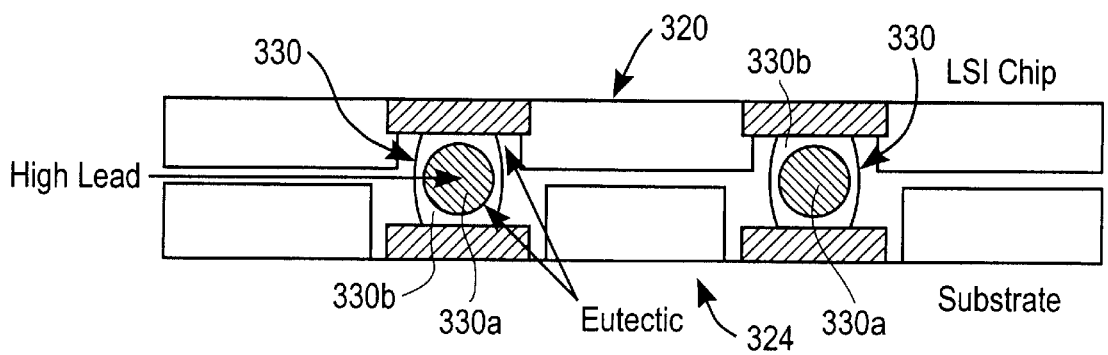

Referring now to FIGS. 49–51, there is illustrated solder bumping using composite solder components to achieve better performance. Traditionally, high lead solder bump 318 is disposed on the side of an LSI chip 320 and eutectic solder 322 on the side of a substrate 324 (see FIG. 49). In such a manner, two bumping steps are needed, one performed on the LSI chip 320 and the other on the substrate 324. It is proposed to use a composite solder structure, generally illustrated as 330 in FIG. 51, having a solder sphere with a core of high lead solder 330a and an overcoat of eutectic solder 330b, to conveniently initially perform bumping on, for example, the chip side 320 followed by the joining to the substrate 324 (see FIG. 51). Therefore, another bumping stop on the substrate side is not needed prior to joining. Such composite spheres 330 can be produced by electroplating of eutectic solder on the high lead solder sphere in, for example, a rotating barrel. Layers between the high lead solder core 330a and eutectic solder overcoat 330b can be added for adhesion or other purposes. Similarly, surface finish layers may be applied on the eutectic solder overcoat 330b for oxidation prevention, wettability, or other purposes. All these solder, interfacial and surface materials may be put down by electroplating, evaporation, etc. In the approach of FIG. 51, the shape of solder joint 330 will be more symmetrical for the top and bottom sides of the joint, namely the chip side and the substrate side, when compared to the traditional approach (see FIG. 49). This may significantly help the mechanical properties of the joints. In the proposed approach, fewer process steps are required since only one bumping stop is needed before joining. Moreover, the mechanical properties are likely to be better due to the symmetry of the joint in the vertical direction, which is usually not achievable in the traditional approach of FIG. 49.

Referring now to FIGS. 52–56, there is provided an improved bumping method for performing solder bumping by way of deposition of a conductor on a dummy substrate, followed by bump transfer. There are several practical difficulties in a conventional bumping method which uses a stencil. For example, it is difficult to print solder paste in apertures of small diameter and high aspect ratio; the uniformity of bump size becomes more difficult to control when the bump volume decreases; and once bumping is performed on the substrate, missing bumps and non-uniformity in bump height may not be easily repaired. There are also several difficulties in achieving bumping by electroplating of solder, such as: the incoming samples are not necessary equipped with a conductive seed layer; and the substrates are not necessary compatible with the plating solution in chemical nature.

Figure 52:
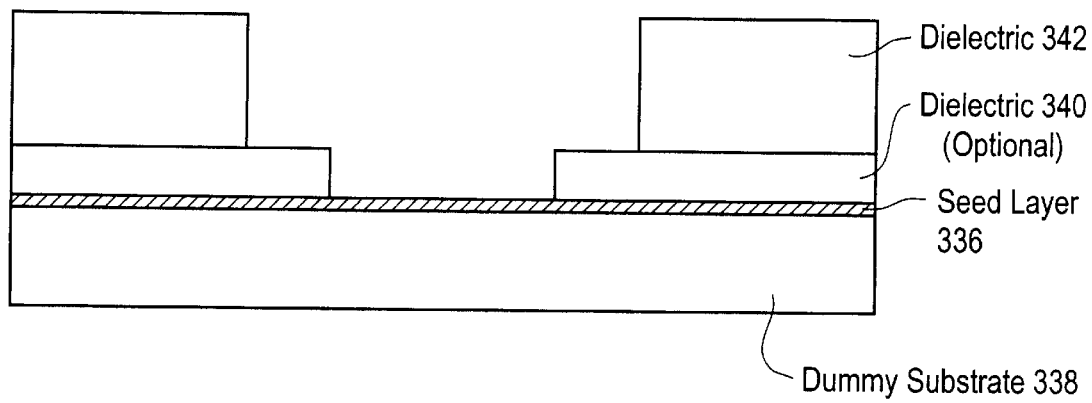
FIGS. 52–56 illustrate an improved bumping method for performing solder bumping by way of deposition of a conductor on a dummy substrate, followed by bump transfer.
Figure 53:
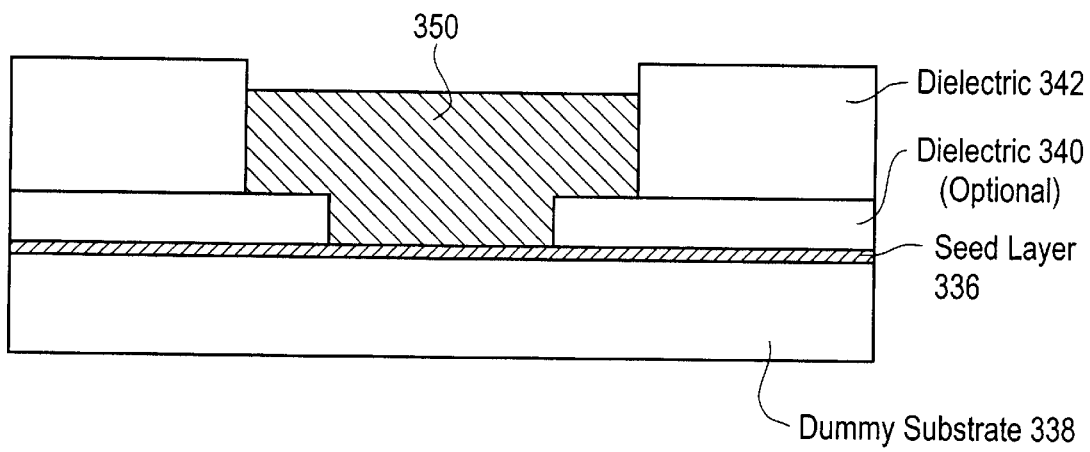
Figure 54:
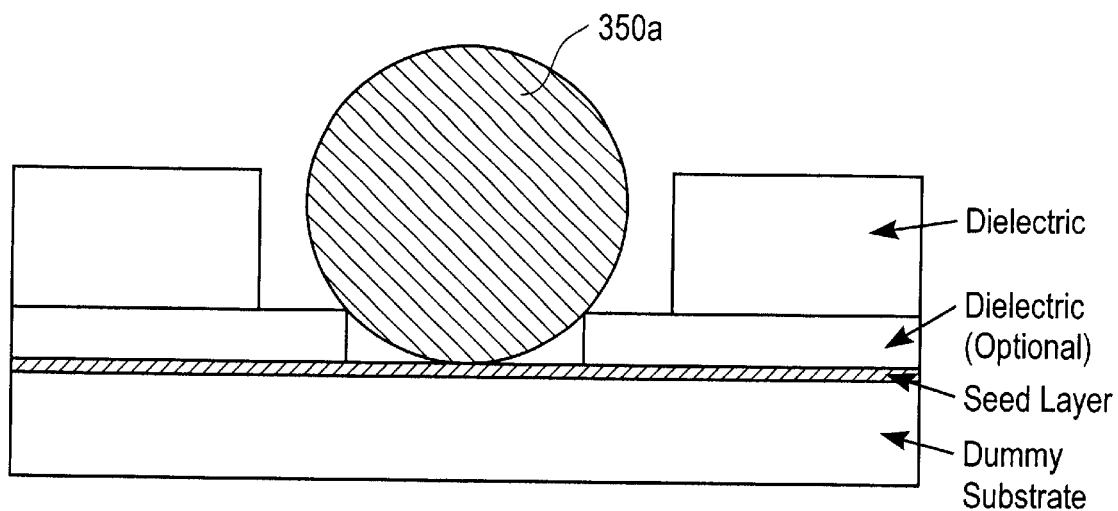
Figure 55:
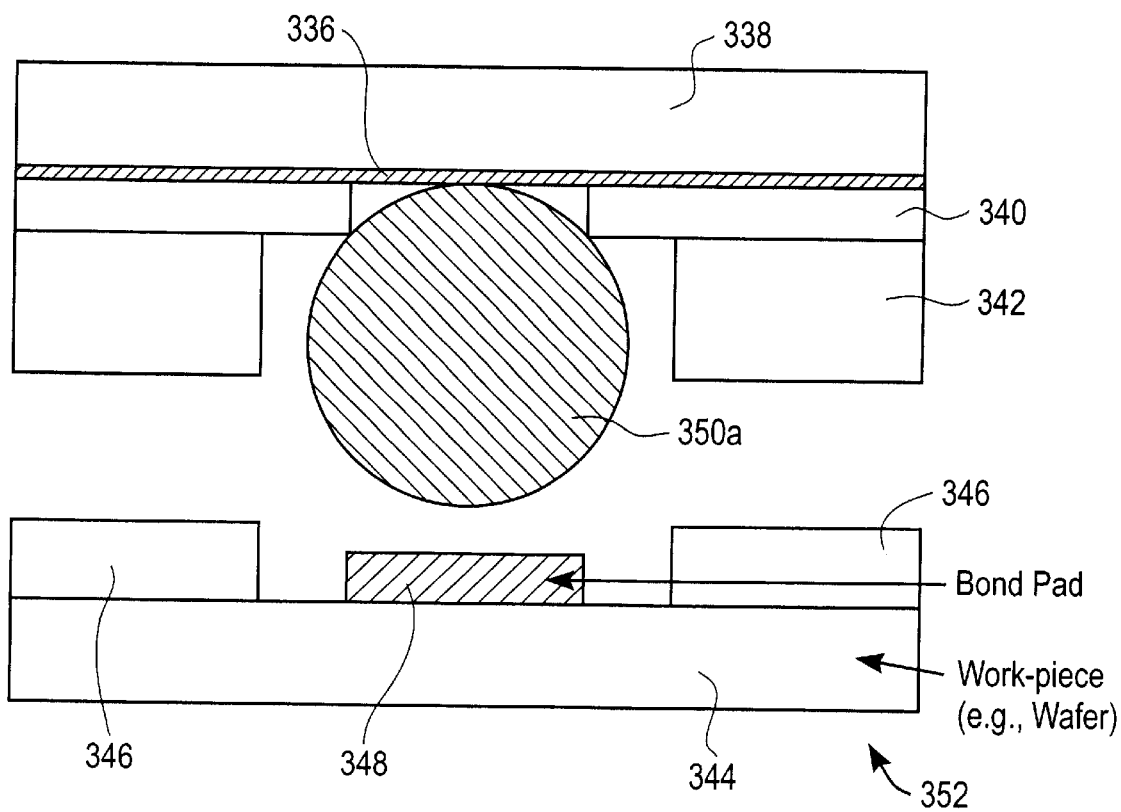
Figure 56:
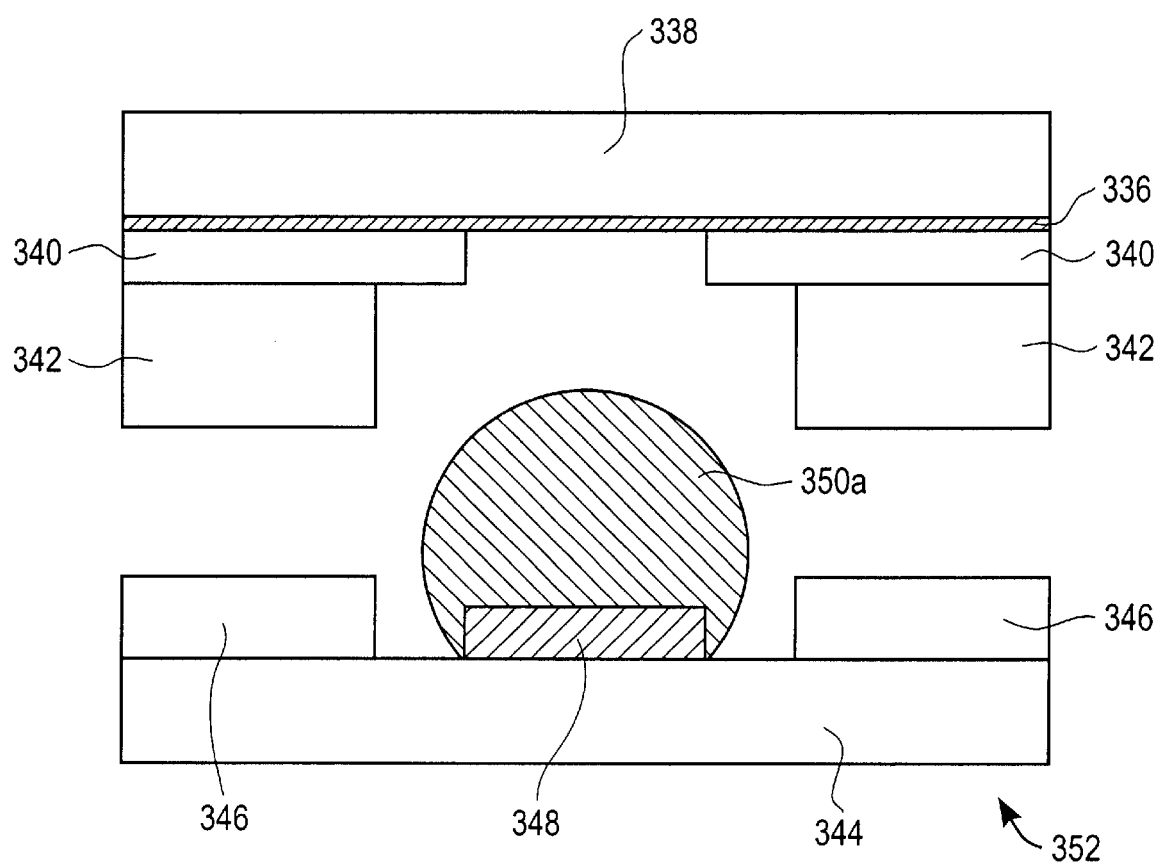

In the improved bumping method of FIGS. 52–56, a conductive seed layer 336 is deposited on a dummy substrate 338 by, e.g., sputtering, followed by coating and patterning of dielectric layers 340 and 342 (e.g., photosensitive polyimide or resist by lithography, polyimide by plasma etch or laser drill, etc.) as shown in FIG. 52. Electroplating of conductor material 350 is then performed (see FIG. 53), followed by reflow of the conductor 350 to form a bump 350a (see FIG. 54). The bottom dielectric layer 340 is to provide anchoring for the bump 350a if positioning is important for alignment between the dummy substrate 338 and the work-piece 352 (as seen in FIG. 55), alignment is usually crucial for fine pitch features. As seen in FIG. 55 work-piece 352 includes a substrate (e.g., a wafer) 344 supporting bonding 348 and patterned dielectric layer 346. Bump 350a is transferred after the top dummy substrate 338 touches down on the work piece 352, heat may be required to form the intermetallic bonding between the bump 350a and the bond pad 348 so as to facilitate the release of the bump 350a from the dummy substrate 338. Thereafter, the dummy substrate 338 may be lifted, as seen in FIG. 56. In the proposed approach of FIGS. 52–56, electroplating is an improvement over printing in filling conductor material into a small recess, providing uniform plating height and consequently bump height, and in avoiding missing bumps. Also, the use of the dummy substrate 338 (including its associated parts or elements) possesses the following advantages: the work-piece 352 (e.g., wafer) does not need to have a seed layer, since electroplating is performed on the dummy substrate 338; the work-piece 352 (e.g., wafer) does not need to be chemically compatible with the plating solution, since electroplating is not performed on the work-piece 352 and the formed bump 350a (as seen in FIG. 54) may be inspected for missing bump(s) or for non-uniformity in bump height before being transferred to the work-piece 352. The latter advantage is important when, for example, the work-piece 352 is a very expensive IC substrate.

Figure 57:
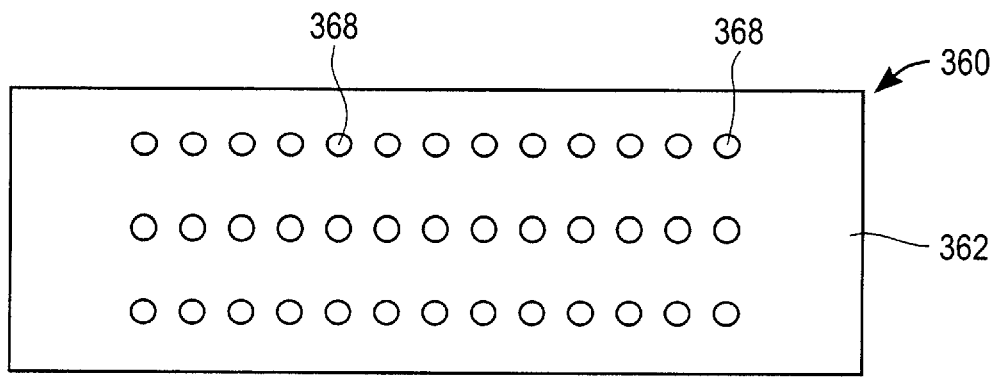
FIGS. 57–59 illustrate a method for stenciling with a polyimide or other suitable material with an adhesive on one side.
Figure 58A:
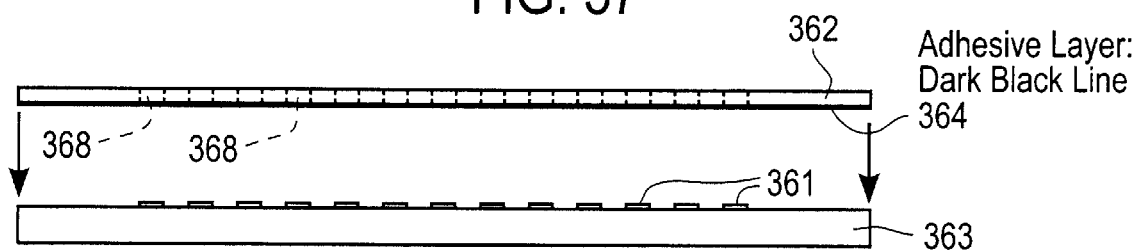
Figure 59:
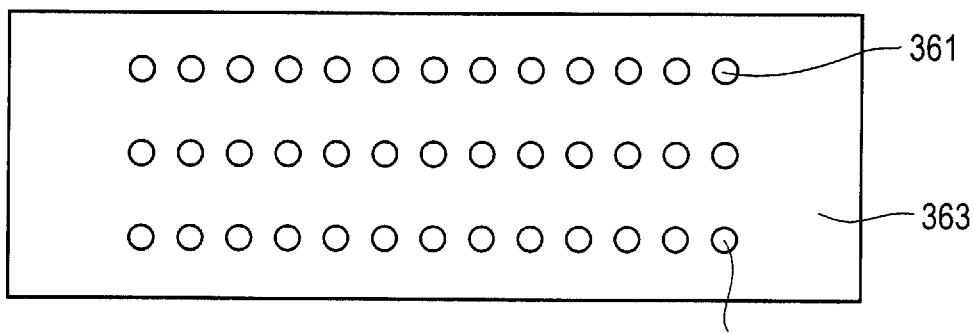
Figure 58B:
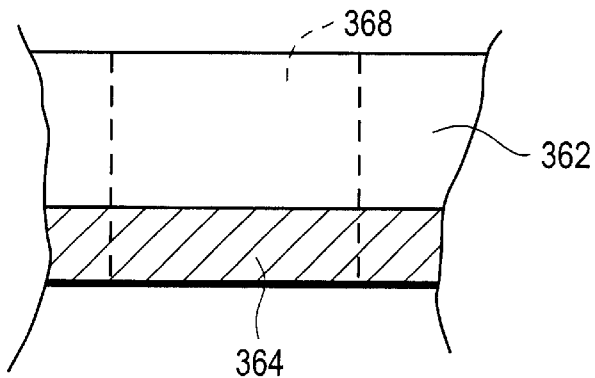

Referring now to FIGS. 57–59, there is seen a free-standing portable stencil 360 whereby solder can be applied to a printed circuit board or any suitable product 363 (see FIG. 58A and FIG. 59), substrate or wafer creating solder bumps 361 (see FIG. 59) to facilitate in the joining of two or more substrates. The object is to create the stencil 360 using a polyimide or other suitable material with an adhesive on one side which will be both cost effective and efficient yielding consistent bump heights and shapes. The process involves taking a polyimide tape 362 or other suitable material with a low tack adhesive (e.g., an acrylic adhesive) layer 364 on one side and using a laser drill, cut the appropriate pattern for the solder application. The process of FIGS. 57–59 would have application with BGAs (ball grid arrays) and other processes with numerous fine pitch connections. It may also be possible that the stencil 360 may be used as the underfill between two layers if an adhesive can be applied to the top layer after the initial reflow of solder bumps.

As indicated, the process broadly illustrated in FIGS. 57–59 comprises obtaining the polyimide tape 362 or other suitable material with the low tack adhesive 364 layer on one side and with the use of a laser drill, cut the appropriate pattern for the solder application. The size (diameter) of the holes 368 and thickness of the material is critical for determining the respective volume of solder bumps 361 which is to be deposited on pads. After drilling the holes 368, the stencil 360 is applied to the product 363 (it may also be possible to drill the pattern after it is applied to the product 363). Second, the solder bumps 361 are applied through the holes 368 and onto the surface of the product 363 using a squeegee or other applicator. The product 363 is then put through a reflow oven. Once the product 363 is reflowed, the product 363 may be chilled (to a suitable temperature) and the stencil 360 removed. The chilling process causes the adhesive to remain attached to the tape 362 and not to the product 363. The tape 362 may also be left on the product 363 and used as an underfill, which will allow the product 363 to be reworked if necessary. This would be a major advantage of using the tape 362 for the underfill. Referring now to FIG. 58A for briefly recapitulating the procedure, there is seen in FIG. 58A the product 363 on which solder bumps 361 are formed by obtaining and taking the tape 362 (e.g., the polyimide tape 362) with the tack adhesive 364, cutting the appropriate pattern in the tape 362 for solder application, applying the stencil 360 (i.e., the tape 362 including holes 368) to a top surface of the product 363, appropriately applying solder through the holes 368 of the tape 362 and onto the exposed top surface of the product 363, reflowing the applied solder, cooling or chilling the reflowed applied solder, and removing the stencil 360 from the top surface of the product 363 to produce the product 363 with solder bumps 361 as best shown in FIG. 59.

Conventional stencils are cut from molybdenum or stainless steel, are expensive, have a limited life and require expensive alignment equipment. The metal stencil process involves partially (or filly) reflowing the solder prior to removing the stencil (then the product has to be reflowed again), which can cause solder bump distortion. After reflow, the stencil has to be removed which can cause bump distortion because the solder has a tendency to adhere to the metal walls of the stencil. Some processes pull the stencil off prior to reflow, but these processes are not desired processes because it is likely that some of the solder will adhere to the side walls or be pulled up completely when the stencil is lifted.

The tape stencil 362 of FIGS. 57–59 would remain attached to the product 363 during the reflow process and could be removed after processing. Only one reflow step is required, eliminating an additional heat cycle which can cause problems. Because the tape 362 is not rigid, the bump shape of solder bumps 361 would not be altered when pulling off the tape stencil. Also, the adhesive 364 on the back of the tape stencil 362 would prohibit solder from creeping under the stencil 362, which can be a problem with metal stencils. The selected adhesive may be specially formulated to withstand the reflow temperatures and come loose through a chilling process without leaving any residue on the product 363.

It may also be possible that the tape 362 (e.g., a polyimide) could remain attached to the product 363 and be used as a dielectric layer between two substrates. If after the initial process and inspection, adhesive is added to the top of the tape stencil, it would adhere to the next substrate as it is reflowed. If this process is not feasible, then a second stencil could be used that has adhesive on both sides and would join the two substrates together.

The holes 368 in the stencil 360 could be added after it has been applied to the substrate using a laser. The copper pads or traces would act as a backstop to limit the depth and size of the hole. Using a laser would insure that the holes do not shift during the application of the stencil. It would also insure that the adhesive stencil could be applied with more pressure without being concerned about distorting the material during application.

The material thickness could be varied to obtain different volumes of solder and the holes 368 could even be cut at various angles to get better solder screening result with fewer voids and to get a more consistent solder volume. Several materials may be suitable for this purpose. One is a polyimide sheet, and the second is a silicon material that has been developed with a light-tack silicon adhesive that could be predrilled or laser drilled after application.

Referring now to FIGS. 60–68 for illustrating a method to manufacture finer pitch z-connections (<150 $\mu$m) for future generation MCMs, a modified Z-MAJIC method and structure is disclosed in FIGS. 60–68. By bumping mating pad surfaces first, good time-zero pad wetting and bonding is assured. Only top to bottom solder filled fusing needs to be accomplished during lamination. This will enable the yields and reliability to be more robust with respect to misalignments. Thus, FIGS. 60–68 illustrate a method and structure to make high density Z-connections in MCPs, SCMs, and PWBs.

Figure 60:
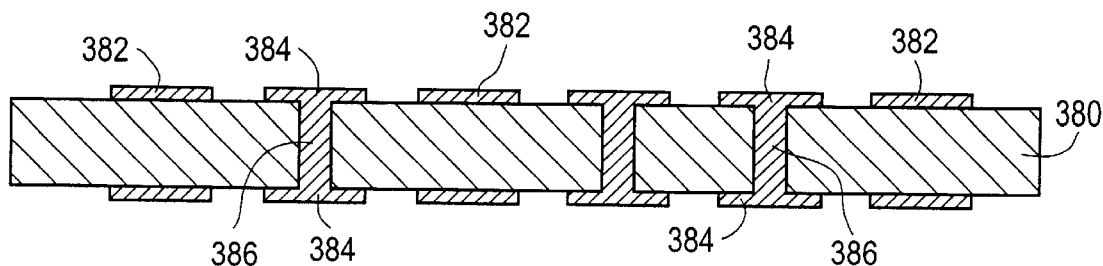
FIGS. 60–68 illustrate a process flow of a method for producing finer pitch Z-connections employing a dielectric substrate having conductive metal circuitry and supporting a bonding sheet including openings wherein reflowed solder bumps are supported by selected metal circuitry.

In FIG. 60, a high density print circuit substrate 380 made or comprising a polymer laminate board, ceramic, glass or flexible circuit made from a dielectric film (such as polyimide) with one or two sides of conductive metal circuitry (e.g., pads 382 and 384 in contact with metal filled vias 386) is shown. Both conventional additive and subtractive process could be used to make the printed circuit on flex. The substrate 380 may also be a semiconductor substrate.

Figure 61:
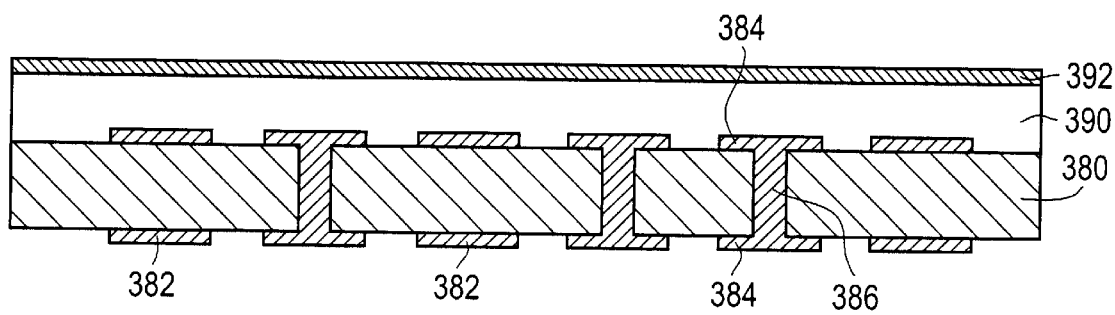

There is seen in FIG. 61, a thin adhesive film 390, referred to hereinafter as a "bonding sheet," laminated with a protection film 392 on top of it by either a hot roller laminator or press to one or both sides of the substrate 380. The bonding sheet 390 can be made from filled or unfilled, including expandable or non-expanding foams, dielectric thermoplastic or thermosetting resins comprised or partially comprised of such materials as (but not limited to) epoxies, polyimides, liquid crystal polymers, cyclo-olefins, polyurethanes, polyamides, benzocyclobutenes, polyamide-imides, polyacrylene ether benzimidazoles, poly ether ketones, siloxanes, poly ether ketones, polyphenylquinoxalines, polyimide iso-indoloquinazolinediones, flouropolymers, BT, cynate ester, etc., and conventional prepregs. The thickness of sheet can be 12.5–200 µm. The protection film 392 can be a polymer film such as polyinude, polyester, mylar, etc. with a thickness of 7.5–100 µm. Another preferred embodiment uses thermoplastic bonding sheets for substrate to substrate bonding. A further preferred embodiment uses thermoplastic bonding sheets in the interior for substrate to substrate bonding and a thermosetting resin on the exposed (solder bumped) layer of the substrate for solder mashing, encapsulation, environmental protection, and handling.

Figure 62:
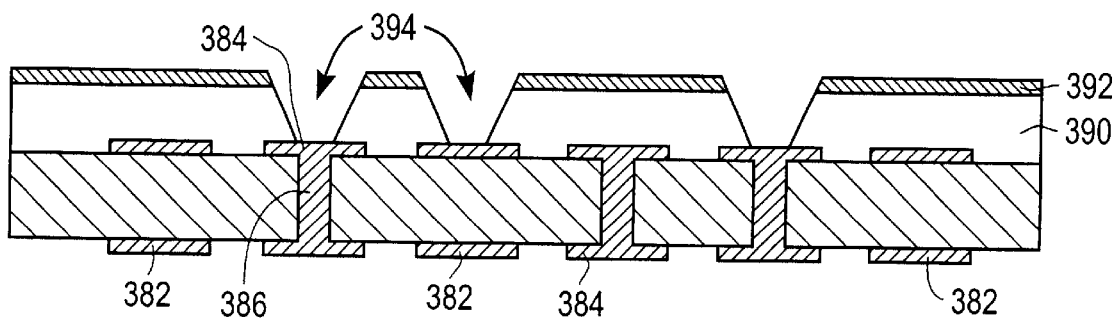

In FIG. 62, blind vias 394 are drilled through the protection film 392 and bonding sheet 390 down to conducting pads 384 by $CO_2$, excimer or YAG-UV laser. The conducting pads 384 may be copper, gold, or copper with a protective or other wettable coating (Au, Au/Ni, Cu, Pd, In, or solder alloys). The pads 384 may be bare copper that are subsequently chemically plated (electro, electroless or directly plating) or physically deposited (sputtering, evaporation, etc.) in the via 394 opening to benefit liquid metal wetting in the soldering operation. A plasma etch step may be necessary to clean up any organic residual on top of opened electrical pads 384. An additional protection layer such as an organic preservative (imidazole, benzotrazole, etc.) or a PADS (plasma-assisted dry soldering) treatment may also be employed to ensure solder wettability. The via 394 diameter may be 20–500 µm.

Figure 63:
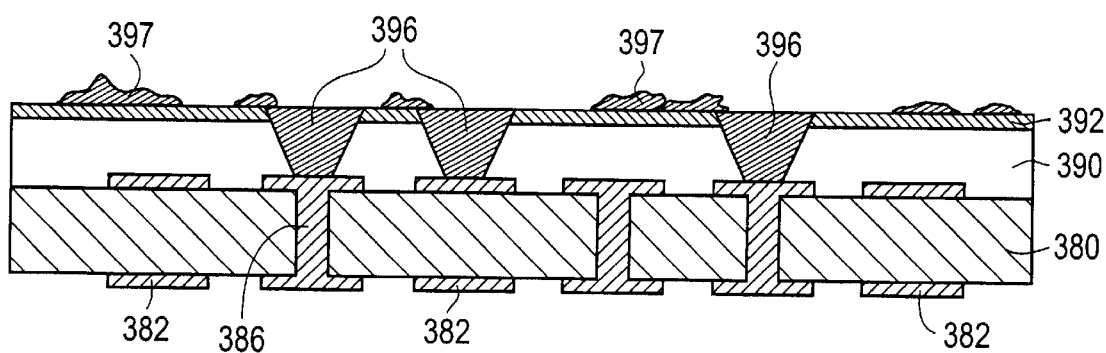

In FIG. 63, solder ink or paste 396 is filled into the via 394 by squeegie printing. Solder powder residue and/or organic carrier 397 may still reside on the protective film 392. The squeegie may also groove or otherwise damage the surface of the protective layer 392.

Figure 64:
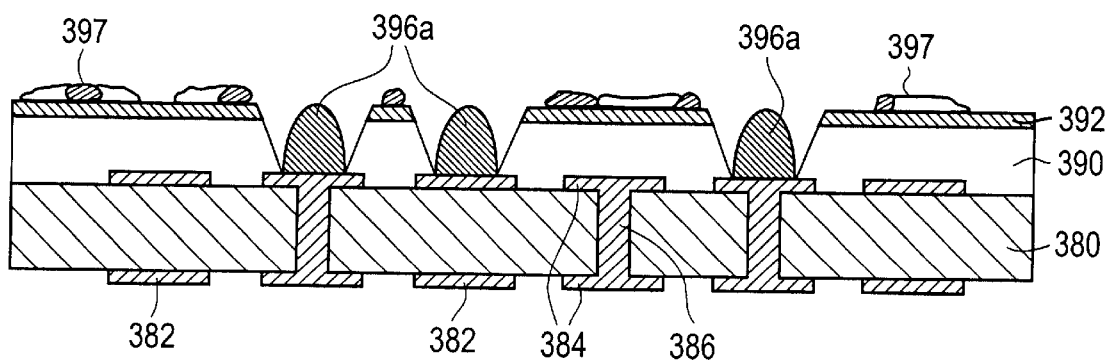
Figure 65:
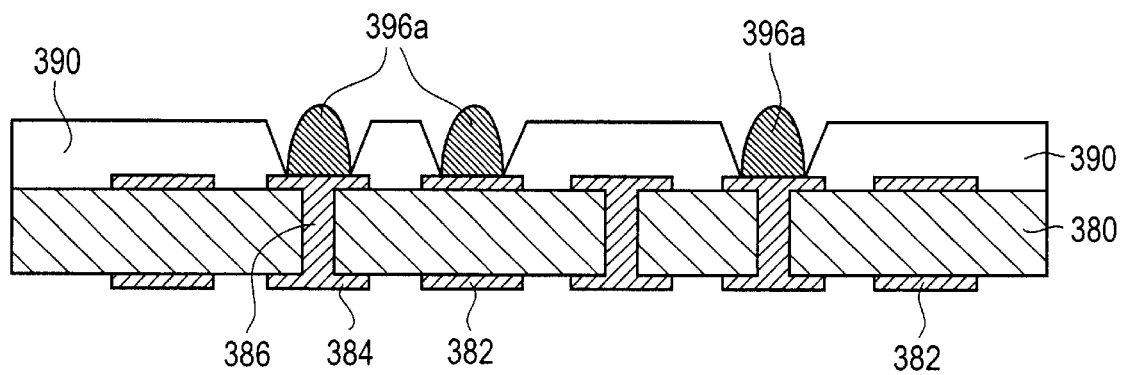

In FIG. 64, the solder ink or paste 396 is reflowed and bumps 396a are formed. The bonding sheet 390 acts as a solder mash. Solder ball residue and organic carrier 397 may still reside on the protective film 392, as shown in FIG. 64. The substrate may then be cleaned. Such cleaning may incorporate commercial flux residue removal methods. A PADS (plasma-assisted dry soldering) treatment may also be employed to protect the solder prior to joining. In FIG. 65, the protection film 392 is peeled off. Any residual organic carrier or residue 397 is thus removed from the bonding sheet 390 surfaces and a clean, undamaged bonding sheet or adhesive layer 390 is exposed.

Figure 66:
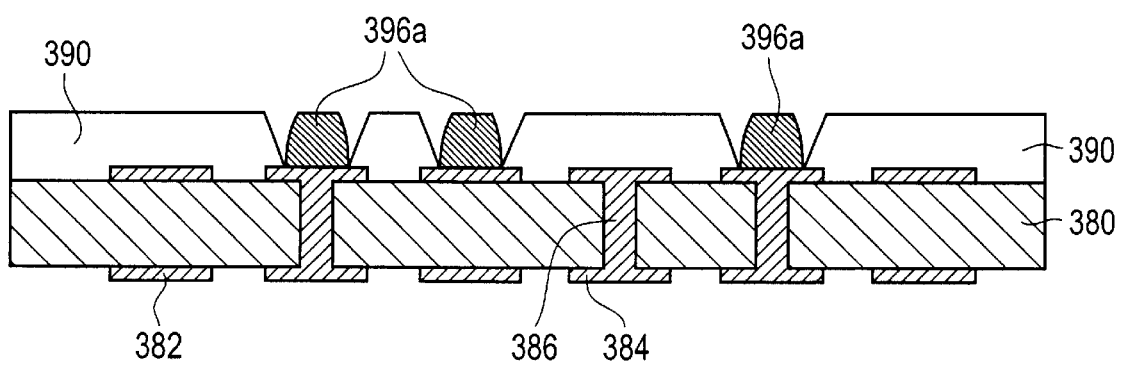

In FIG. 66, the reflowed bumps 396a are optionally planarized and made more uniform in bump height. This planarization step may be accomplished mechanically, thermomechanically or chemomechanically. The substrate 380 may then be cleaned in a manner that does not use solvents that would undesirably affect the adhesive or bonding sheet 390. A PADS (plasma-assisted dry soldering) treatment may also be employed to protect the solder prior to joining.

Figure 67:
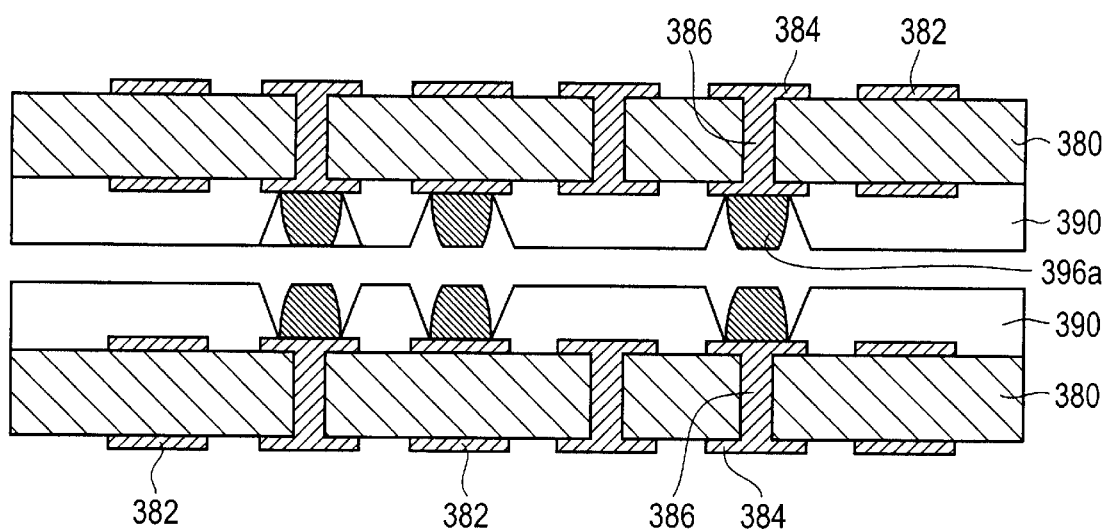
Figure 68:
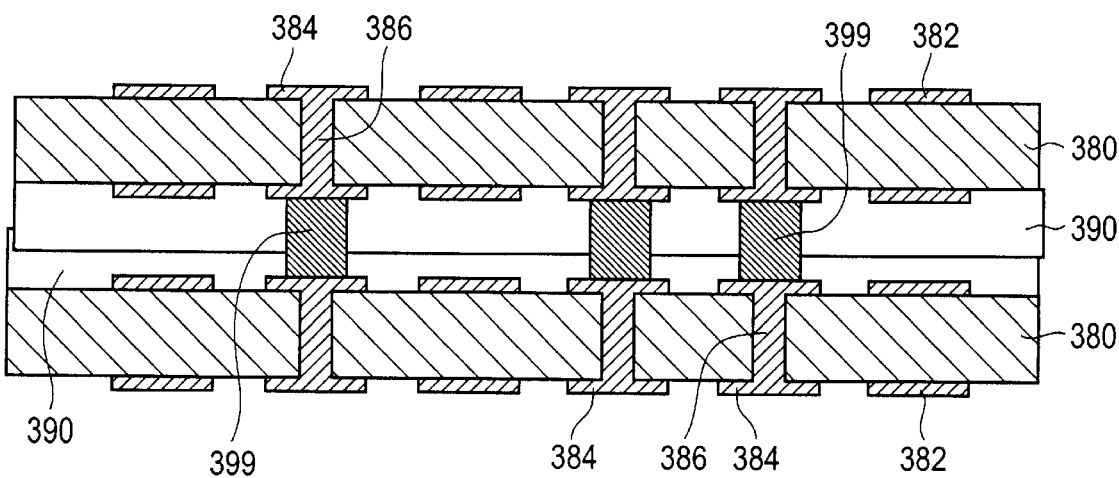

In FIG. 67, two mating (and similarly processed) substrates 380—380 are aligned (one or both of which may be conventional rigid printed circuit board, printed circuit flex, semiconductor, glass or ceramic) such that the solder bumps 396a—396a are in contact with mating pads possessing a solder wettable surface (e.g. Au, Au/Ni, Cu, Pd, In, Sri, or solder alloys). In some embodiments, fluxing may be employed to enhance solderability and joining. In FIG. 68, the aligned parts are laminated together by appropriate thermal profile in a lamination press so that the solder bumps 396a—396a will melt and form a solder filled and bonding sheets 390—390 will adhere to each other so that the whole structure is bonded together.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

Therefore, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for fabricating a composite interposer comprising the steps of:
    (a) disposing a silicon layer on a substrate:
    (b) selectively etching the silicon layer down to the substrate to develop silicon openings with a silicon profile, and to expose part of the substrate;
    (c) forming vias through the exposed part of the substrate;
    (d) filling the vias and the silicon openings with a filler material to form filled silicon openings and filled vias;
    (e) forming first openings through the filled silicon openings and through the filled vias;
    (f) forming second openings through filler material to expose semiconductor devices on the silicon layer; and
    (g) interconnecting electrically, through the first openings and through the second openings, the exposed semiconductor devices with pads.

2. The method of claim 1 wherein each of said pads is selected from the group of pads consisting of voltage pads, ground pads, and signal pads.

3. The method of claim 1 wherein said pads are coupled to the bottom of the substrate.

4. The method of claim 1 wherein said selectively etching the silicon layer down to the substrate additionally includes forming a plurality of spaced silicon layers supported by said substrate.

5. The method of claim 2 wherein said selectively etching the silicon layer down to the substrate additionally includes forming a plurality of spaced silicon layers supported by said substrate.

6. The method of claim 4 wherein said forming vias additionally includes forming a plurality of spaced substrates with each spaced substrate supporting a spaced silicon layer.

7. The method of claim 1 additionally comprising filling the first opening with a dielectric filler after said interconnecting electrically.

8. The method of claim 7 additionally comprising filling the first opening with a dielectric filler after said interconnecting electrically.

9. A method for fabricating a composite interposer comprising the steps of:
    (a) disposing a silicon layer on a substrate;
    (b) selectively etching the silicon layer down to the substrate to develop silicon openings with a silicon profile, and to expose part of the substrate;

(c) forming vias through the exposed part of the substrate;

(d) filling the vias and the silicon openings with a filler material comprising a photodefinable epoxy polymer having an aspect ratio to form filled silicon openings and filled vias;

(e) forming first openings through the filled silicon openings and through the filled vias;

(f) forming second openings through filler material to expose semiconductor devices on the silicon layer; and (g) interconnecting electrically, through the first openings and through the second openings, the exposed semiconductor devices with pads.

10. The method of claim 9 wherein each of said pads is selected from the group of pads consisting of voltage pads, ground pads, and signal pads.

11. The method of claim 9 wherein said pads are coupled to the bottom of the substrate.

12. The method of claim 9 wherein said selectively etching the silicon layer down to the substrate additionally includes forming a plurality of spaced silicon layers supported by said substrate.

13. The method of claim 10 wherein said selectively etching the silicon layer down to the substrate additionally includes forming a plurality of spaced silicon layers supported by said substrate.

14. The method of claim 9 additionally comprising filling the first opening with a dielectric filler after said interconnecting electrically.

15. The method of claim 12 additionally comprising filling the first opening with a dielectric filler after said interconnecting electrically.

16. The method of claim 9 wherein said aspect ratio ranges from about 2:1 to about 40:1.

17. The method of claim 15 wherein said aspect ratio ranges from about 6:1 to about 8:1.

18. A method for fabricating a composite interposer comprising the steps of:

(a) disposing a plurality of conductive elements on a top of a silicon layer, leaving part of a top of the silicon layer exposed;

(b) disposing dielectric material over the conductive elements and the exposed top of the silicon layer;

(c) selectively removing dielectric material from over the conductive elements to expose conductive elements;

(d) forming a voltage plane and a ground plane;

(e) selectively removing silicon from a bottom of the silicon layer to form silicon openings and to expose part of the dielectric material;

(f) filling the silicon openings with a polymer filler, leaving a polymer filler layer on the bottom of the silicon layer;

(g) securing a substrate to the polymer filler layer;

(h) forming vias through the substrate, the polymer filler, and the dielectric material; and (i) plating the vias.

19. The method of claim 18 additionally comprising testing, prior to said selectively removing dielectric material, the silicon layer including the conductive elements to determine if any of the conductive elements are defective.

20. The method of claim 18 wherein said forming a voltage plane includes depositing a metal voltage layer on said dielectric material and coupling same to said exposed conductive elements.

21. The method of claim 20 additionally comprising selectively removing at least one portion of the metal voltage layer to produce a residual voltage layer and to expose metal-filled conductive elements; and disposing a second dielectric layer over the residual voltage layer and the exposed metal-filled conductive elements.

22. The method of claim 21 wherein said forming a ground plane comprises forming a plurality of vias in said second dielectric layer to produce a residual second dielectric layer and to reexpose the exposed metal-filled conductive elements; and depositing a metal ground metal on said residual second dielectric layer and in said vias in said second dielectric layer to couple said metal-filled conductive elements to said metal ground metal.

23. The method of claim 22 additionally comprising removing a portion of the metal ground layer to produce exposed second dielectric layer.

24. The method of claim 23 wherein said forming vias includes forming vias through said produced exposed second dielectric layer.

25. The method of claim 24 additionally comprising filling the plated vias.

26. The method of claim 25 additionally comprising capping the filled plated vias.

27. The method of claim 26 wherein said conductive element is a metal pad.

28. The method of claim 18 wherein said conductive element is a semiconductor device.

29. A method for fabricating a composite interposer comprising the steps:

(a) disposing a plurality of conductive elements on top of a silicon layer, leaving part of a top of the silicon layer exposed;

(b) disposing dielectric material over the conductive elements and the exposed top of the silicon layer;

(c) selectively removing silicon from a bottom of the silicon layer to form silicon openings and to expose part of the dielectric material;

(d) filling the silicon openings with a polymer filler, leaving a polymer filler layer on the bottom of the silicon layer;

(e) securing a substrate to the polymer filler layer;

(f) selectively removing dielectric material from over the conductive elements;

(g) forming vias through the substrate, the polymer filler layer, and the dielectric material; and (h) plating the vias.

30. The method of claim 1 additionally comprising testing the semiconductor devices for defectiveness.

31. The method of claim 9 additionally comprising testing the semiconductor devices for defectiveness.

32. The method of claim 18 additionally comprising testing the conductive elements for defectiveness.

33. The method of claim 29 additionally comprising testing the conductive elements for defectiveness.

34. A composite interposer produced in accordance with the method of claim 1.

35. A composite interposer produced in accordance with the method of claim 9.

36. A composite interposer produced in accordance with the method of claim 18.

37. A composite interposer produced in accordance with the method of claim 29.

* * * * *